(12) United States Patent
Yamashita et al.

(10) Patent No.: US 9,640,111 B2
(45) Date of Patent: May 2, 2017

(54) EL DISPLAY DEVICE AND ELECTRONIC APPARATUS TO COMPENSATE BACK-GATE EFFECT ON LIGHT-EMITTING UNIT DRIVE TRANSISTOR

(71) Applicant: Sony Corporation, Tokyo (JP)

(72) Inventors: Junichi Yamashita, Tokyo (JP); Yusuke Onoyama, Kanagawa (JP); Tetsuo Minami, Tokyo (JP); Naobumi Toyomura, Kanagawa (JP); Tetsuro Yamamoto, Kanagawa (JP); Katsuhide Uchino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/704,219

(22) Filed: May 5, 2015

(65) Prior Publication Data

US 2015/0235592 A1    Aug. 20, 2015

Related U.S. Application Data

(63) Continuation of application No. 13/588,495, filed on Aug. 17, 2012, now Pat. No. 9,041,628.

(30) Foreign Application Priority Data

Aug. 23, 2011  (JP) ................................ 2011-181797

(51) Int. Cl.
   *G09G 3/3233*   (2016.01)
   *H01L 27/32*    (2006.01)
   (Continued)

(52) U.S. Cl.
   CPC ....... *G09G 3/3233* (2013.01); *H01L 27/3262* (2013.01); *G09G 3/30* (2013.01);
   (Continued)

(58) Field of Classification Search
   CPC .......... G09G 3/30; G09G 3/32; G09G 3/3208; G09G 3/3216; G09G 3/3225;
   (Continued)

(56) References Cited

U.S. PATENT DOCUMENTS 8,426,876 B2   4/2013  Yamazaki et al.
8,659,519 B2   2/2014  Abe et al.
(Continued)

FOREIGN PATENT DOCUMENTS

JP       2007-310311 A     11/2007

OTHER PUBLICATIONS

Extended European Seach Report issued Feb. 7, 2013 for corresponding European Application No. 12 176 515.0.
(Continued)

*Primary Examiner* — Larry Sternbane
*Assistant Examiner* — Darlene M Ritchie
(74) *Attorney, Agent, or Firm* — Chip Law Group

(57) ABSTRACT

A display device includes: a plurality of light-emitting elements, each light-emitting element having a light-emitting unit and a driving circuit for driving the light-emitting unit. The driving circuit at least includes (A) a drive transistor having source/drain regions, a channel forming region, and a gate electrode, (B) a video signal write transistor having source/drain regions, a channel forming region, and a gate electrode, and (C) a capacitive unit. In the drive transistor, (A-1) one of the source/drain regions is connected to the corresponding current supply line, (A-2) the other region of the source/drain regions is connected to the light-emitting unit and connected to one end of the capacitive unit, and forms a second node, and (A-3) the gate electrode is connected to the other region of the source/drain regions of the video signal write transistor and connected to the other end of the capacitive unit, and forms a first node.

9 Claims, 23 Drawing Sheets

(51) Int. Cl.
*G09G 3/3225* (2016.01)
*G09G 3/30* (2006.01)

(52) U.S. Cl.
CPC ... *G09G 3/3225* (2013.01); *G09G 2300/0426* (2013.01); *H01L 27/3225* (2013.01); *H01L 27/3244* (2013.01)

(58) Field of Classification Search
CPC .... G09G 3/3233; G09G 3/325; G09G 3/3258; G09G 3/3266; G09G 3/3275; G09G 3/3283; G09G 3/3291; G09G 2300/0809; G09G 2300/0814; G09G 2300/0819; G09G 2300/0823; G09G 2300/0828; G09G 2300/0833; G09G 2300/0838; G09G 2300/0842; G09G 2300/04; G09G 2300/0404; G09G 2300/0408; G09G 2300/0413; G09G 2300/0417; H01L 27/3225; H01L 27/3248; H01L 27/0688; H01L 27/3255; H01L 27/3262; H01L 27/3244
See application file for complete search history.

(56) References Cited

U.S. PATENT DOCUMENTS

| | | |
|---|---|---|
| 2004/0036071 A1 | 2/2004 | Yamazaki et al. |
| 2005/0225377 A1 | 10/2005 | Kobayashi et al. |
| 2007/0045659 A1 | 3/2007 | Abe et al. |
| 2007/0057826 A1 | 3/2007 | Yajima et al. |
| 2007/0096168 A1 | 5/2007 | Jeon |
| 2008/0006875 A1 | 1/2008 | Ohtsuka et al. |
| 2009/0008665 A1 | 1/2009 | Lee et al. |
| 2009/0058771 A1 | 3/2009 | Toyomura et al. |
| 2009/0243512 A1 | 10/2009 | Nagumo |
| 2010/0033463 A1 | 2/2010 | Nishimura et al. |
| 2010/0118017 A1 | 5/2010 | Yamashita et al. |
| 2010/0182226 A1 | 7/2010 | Umezaki |
| 2010/0220117 A1 | 9/2010 | Kimura |
| 2011/0205218 A1* | 8/2011 | Tsuchi ............... G09G 3/3283 345/212 |
| 2012/0146887 A1 | 6/2012 | Koyama |
| 2013/0293602 A1 | 11/2013 | Nathan et al. |

OTHER PUBLICATIONS

Charles F. Hawkins, et al. "Introduction to Digital Electronics, Chapter 3 MOSFET Transistors" Jan. 1, 2005, XP055051792, URL: http://we.archive.org/liveweb/http://www.scitechpub.com/Hawkins_ch_3.pdf [retrieved from the Internet Jan. 29, 2013] pp. 3 to 21 & 3 to 23.

Lee Eng Han, et al. CMOS Transistor Layout KungFu, May 6, 2006, XP055051557,URL://www.eda-utilities.com/CMOS_Transistor_layout_KungFu.pdf [retrieved on Jan. 29, 2013] p. 26.

"MOSFET Layers and Layout" Dec. 21, 2006, XP055051776, Queens University URL://bmf.ece.queensu.ca/mediawiki/in dex. php/MOSFET_layers_and_layout [retrieved on Jan. 30, 2013] p. 3.

"Chapter 3 CMOS Processing Technology (How to make a CMOS)" Nov. 7, 2002, XP055051904, Graduate Institute of Electronics Engineering, National Taiwan Universityy URL: http:..web. archive.org/web/20021107235151/http://access.ee.ntu.edu.tw/course/VLSI_design_89second/course_ourtlin/Ch3_1.PDF [retrieved on Jan. 31, 2013] p. 10.

* cited by examiner

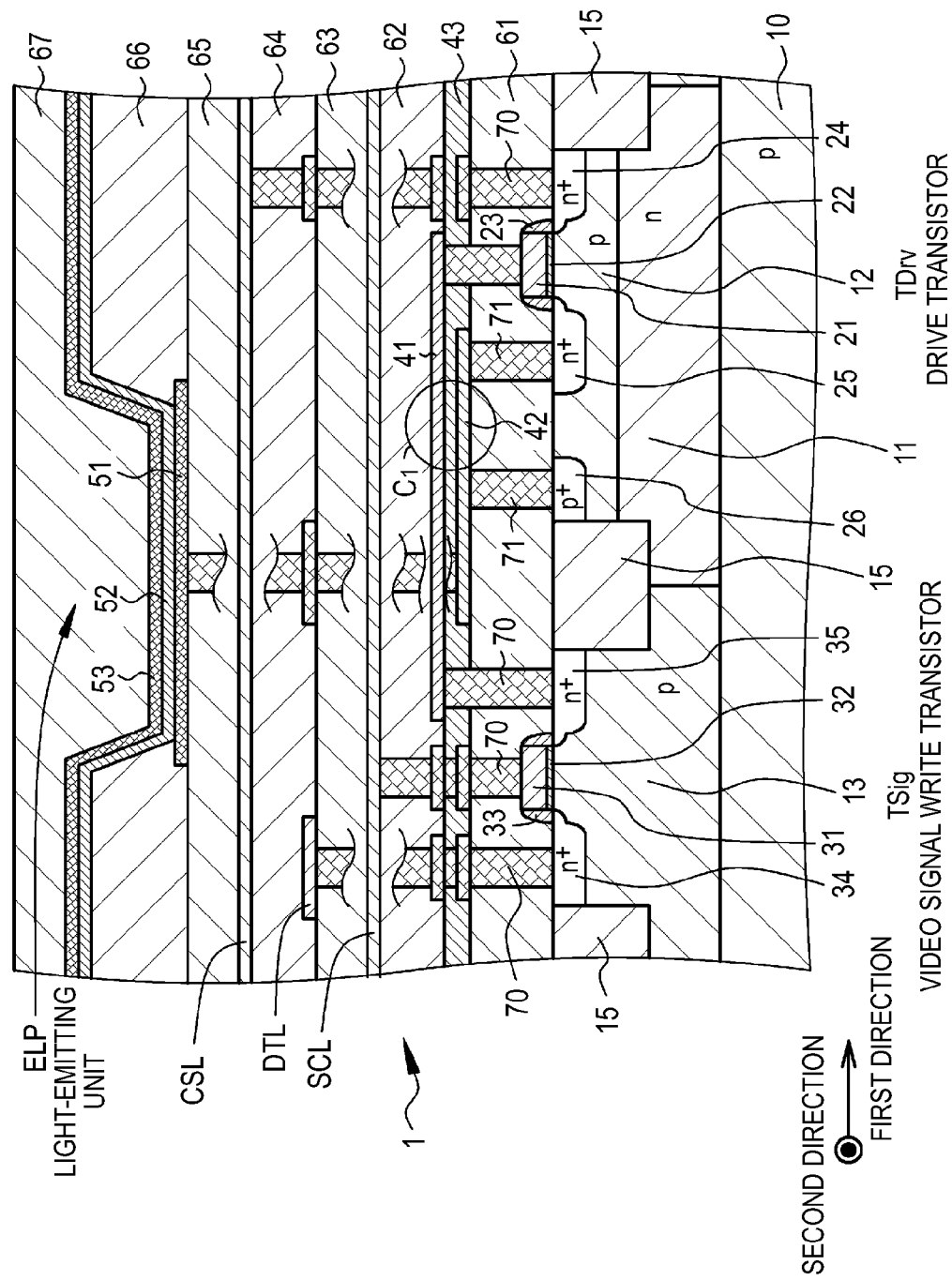

[5Tr/1C DRIVING CIRCUIT]

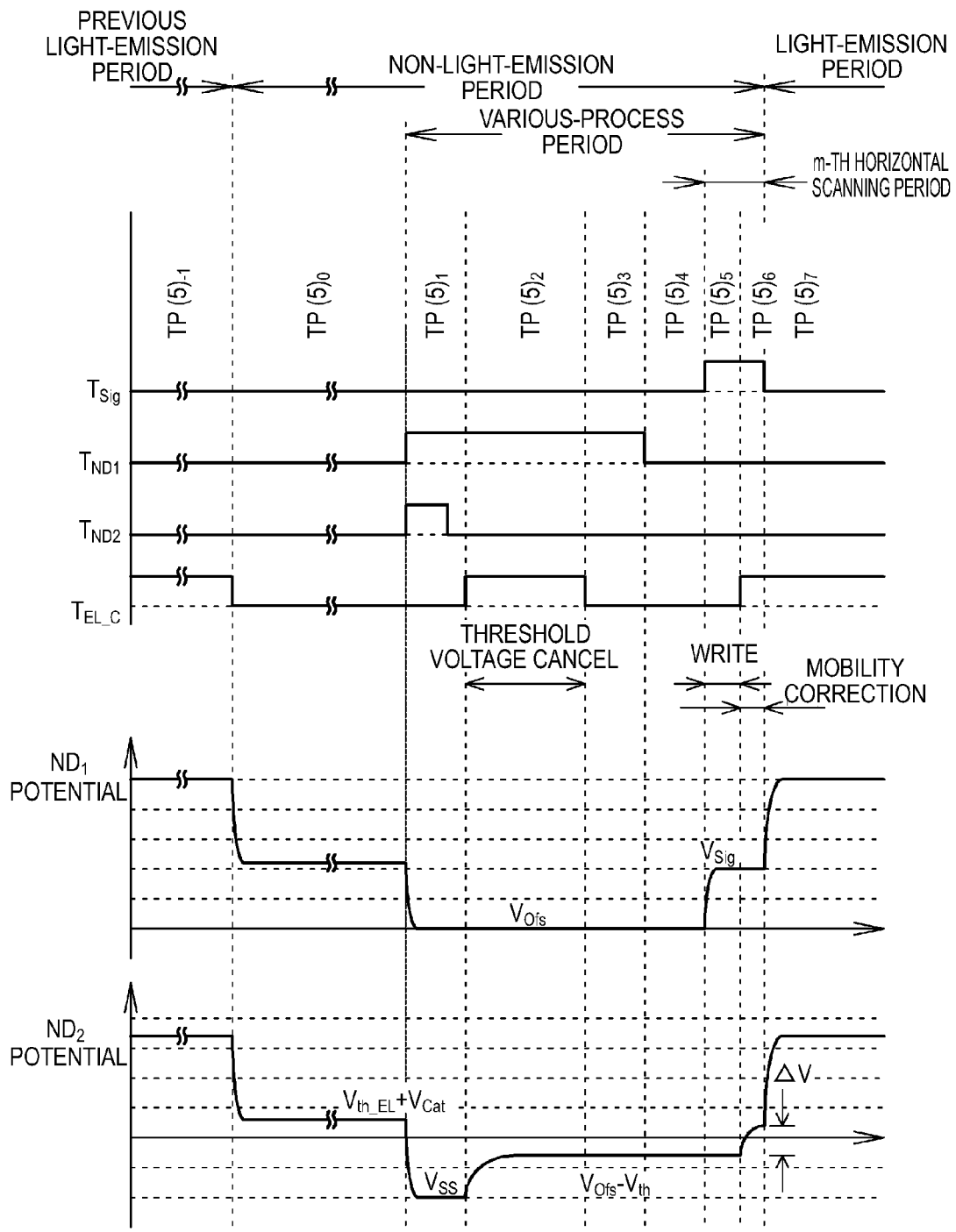

[5Tr/1C DRIVING CIRCUIT]

[ TP (5) -1 ]

[ TP (5) 1 ]

[ TP (5) 1 ] (CONTINUE)

[ TP (5) 2 ]

[5Tr/1C DRIVING CIRCUIT]

[ TP (5)$_3$ ]

[ TP (5)$_4$ ]

[ TP (5)$_5$ ]

[ TP (5)$_6$ ]

[ TP (5)$_7$ ]

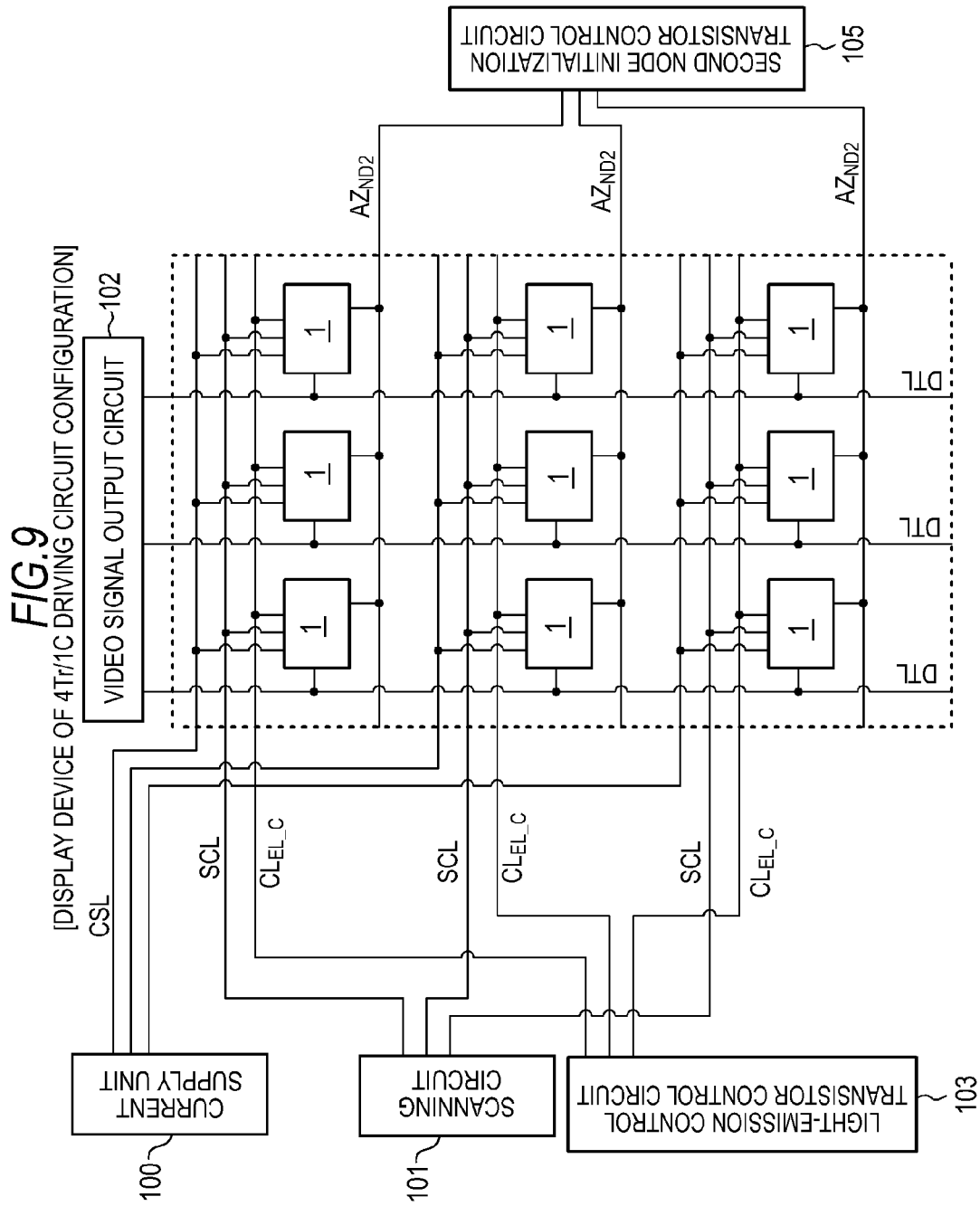

[4Tr/1C DRIVING CIRCUIT]

[4Tr/1C DRIVING CIRCUIT]

[4Tr/1C DRIVING CIRCUIT]

[ TP (4) $_{-1}$ ]

[ TP (4) $_1$ ]

[ TP (4) $_2$ ]

[ TP (4) $_3$ ]

[4Tr/1C DRIVING CIRCUIT]

[ TP (4)$_4$ ]

[ TP (4)$_5$ ]

[ TP (4)$_6$ ]

[ TP (4)$_7$ ]

[3Tr/1C DRIVING CIRCUIT]

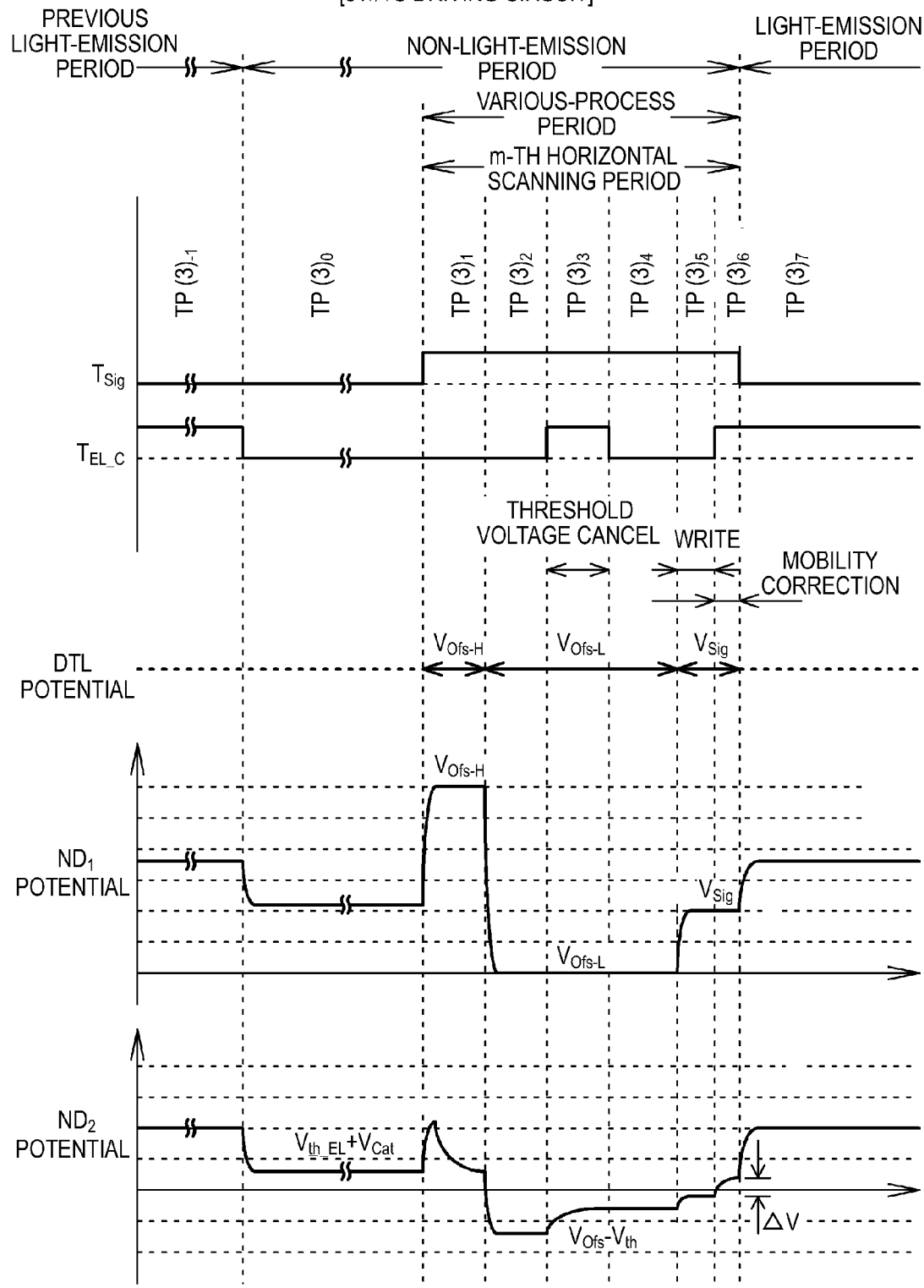

[3Tr/1C DRIVING CIRCUIT]

[ TP (3) $_{-1}$ ]

[ TP (3) $_{0}$ ]

[ TP (3) $_{1}$ ]

[ TP (3) $_{2}$ ]

[3Tr/1C DRIVING CIRCUIT]

[ TP (3)$_3$ ]

[ TP (3)$_4$ ]

[ TP (3)$_5$ ]

[ TP (3)$_6$ ]

[ TP (3)$_7$ ]

[2Tr/1C DRIVING CIRCUIT]

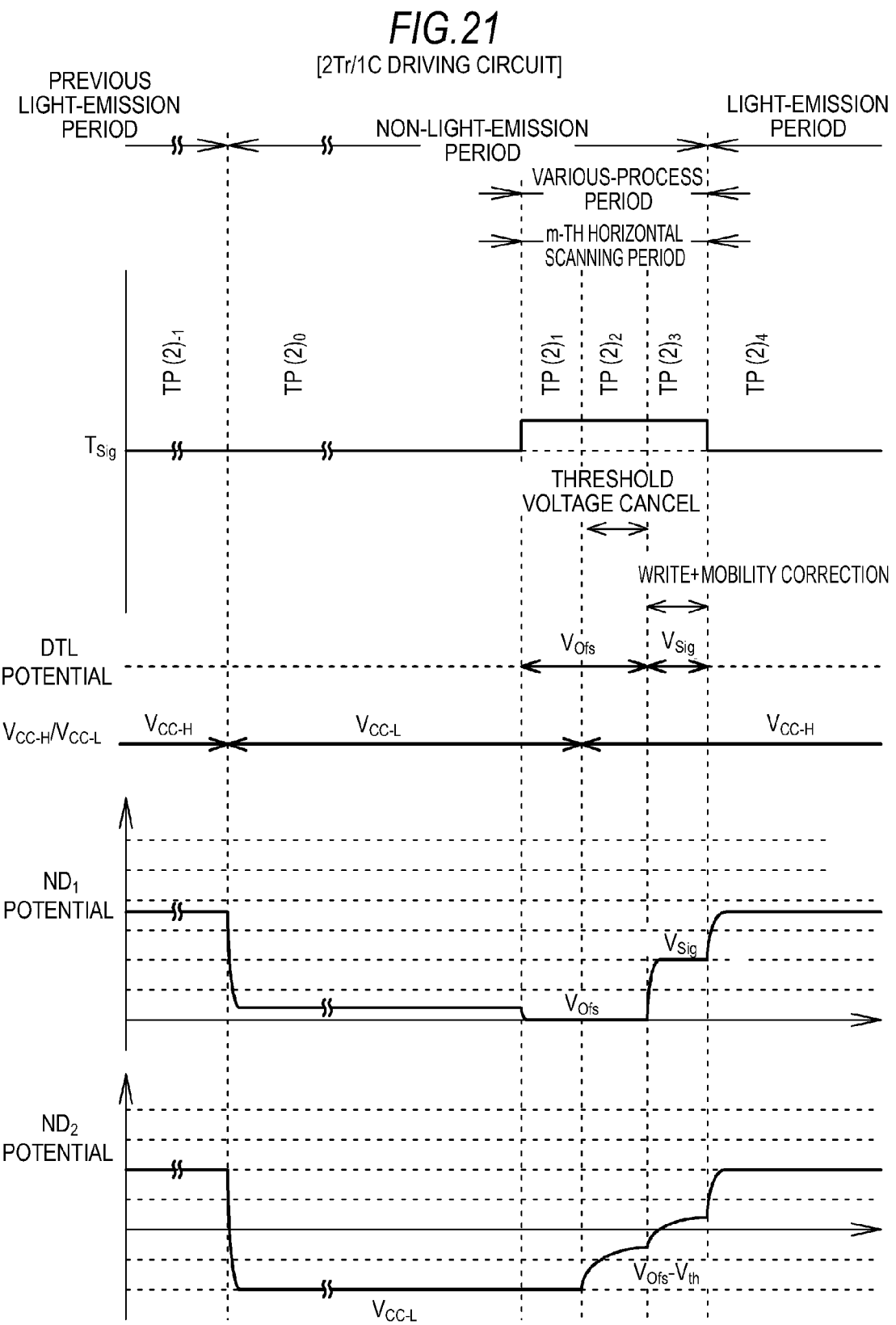

[2Tr/1C DRIVING CIRCUIT]

[ TP(2)₋₁ ]

[ TP(2)₀ ]

[ TP(2)₁ ]

[ TP(2)₂ ]

[ TP(2)₃ ]

[ TP(2)₄ ]

EL DISPLAY DEVICE AND ELECTRONIC APPARATUS TO COMPENSATE BACK-GATE EFFECT ON LIGHT-EMITTING UNIT DRIVE TRANSISTOR

CROSS REFERENCE TO RELATED APPLICATIONS

This is a Continuation application of U.S. patent application Ser. No. 13/588,495, filed on Aug. 17, 2012, which claims priority from Japanese Application JP 2011-181797, filed in the Japan Patent Office on Aug. 23, 2011, the entire contents of which being incorporated herein by reference.

FIELD

The present disclosure relates to a display device and an electronic apparatus.

BACKGROUND

In recent years, as a display device which is represented by a liquid crystal display, an organic electroluminescence display device (hereinafter, simply abbreviated as "organic EL display device") using an organic electroluminescence element (hereinafter, simply abbreviated as "organic EL element") is attracting attention. The organic EL display device is of a self-luminous type, and has a characteristic of low power consumption. It is considered that the organic EL display has sufficient responsiveness to a high-definition and high-speed video signal, and the development for practical use and commercialization are closely proceeding.

The organic EL display device has a plurality of light-emitting elements each of which includes a light-emitting unit ELP and a driving circuit for driving the light-emitting unit ELP. For example, FIG. 23A is an equivalent circuit diagram of the light-emitting element which includes the driving circuit having two transistors and one capacitive unit (for example, see JP-A-2007-310311). The driving circuit has a drive transistor TDrv which includes source/drain regions, a channel forming region, and a gate electrode, a video signal write transistor TSig which includes source/drain regions, a channel forming region, and a gate electrode, and a capacitive unit C1. Reference numeral CEL represents parasitic capacitance of the light-emitting unit ELP.

In the drive transistor $T_{Drv}$, one region of the source/drain regions is connected to a current supply line CSL, and the other region of the source/drain regions is connected to the light-emitting unit ELP and also connected to one end of the capacitive unit $C_2$ to constitute a second node $ND_2$. The gate electrode of the drive transistor $T_{Drv}$ is connected to the other region of the source/drain regions of the video signal write transistor $T_{Sig}$ and also connected to the other end of the capacitive unit $C_1$ to constitute a first node $ND_1$.

In the video signal write transistor $T_{Sig}$, one region of the source/drain regions is connected to a data line DTL, and the gate electrode is connected to a scanning line SCL.

The current supply line CSL is connected to the current supply unit 100, the data line DTL is connected to the video signal output circuit 102, and the scanning line SCL is connected to the scanning circuit 101. At the time of light emission of the light-emitting unit ELP (that is, before and after light emission of the light-emitting unit ELP), a current flows from the current supply unit 100 to the light-emitting unit ELP through the current supply line CSL and the drive transistor $T_{Drv}$, and the potential of the anode electrode (corresponding to the second node $ND_2$) of the light-emitting unit ELP rises until the operation point corresponding to the current value is reached.

SUMMARY

On the other hand, when a driving circuit having an n-channel drive transistor $T_{Drv}$ is formed within a p-type well provided in the silicon semiconductor substrate, for stable operation, a configuration in which the p-type well is at a constant potential, for example, the p-type well is grounded is considered. In other words, when the drive transistor $T_{Drv}$ is regarded as a 4-terminal transistor, a configuration in which a back gate terminal is grounded is considered. However, when this configuration is used, the following problems may occur. That is, at the time of light emission of the light-emitting unit ELP using this driving circuit, as described above, the potential of the second node $ND_2$ rises. Incidentally, since there is no change in the potential of the p-type well, the potential $V_{bs}$ between the p-type well and the source region of the drive transistor $T_{Drv}$ rises, and a current $I_{ds}$ which flows in the drive transistor $T_{Drv}$ decreases due to a so-called back gate effect. As a result, luminance of the light-emitting unit ELP becomes lower than desired luminance. Accordingly, in order to solve this phenomenon, it is necessary to increase the value of a signal which is output from the video signal output circuit 102 in prospect of the back gate effect, causing a problem in that power consumption of the organic EL display device increases. When the light-emitting unit ELP is deteriorated, as shown in a schematic view of FIG. 23B, the I-V characteristic of the light-emitting unit ELP is deteriorated. Accordingly, in order that the same current as before deterioration flows in the light-emitting unit ELP, it is necessary to further increase the potential of the anode electrode. Incidentally, when the potential of the anode electrode (corresponding to the second node $ND_2$) is further increased, the same problem as described above occurs due to the back gate effect.

It is therefore desirable to provide a display device having a configuration or structure which is capable of suppressing the occurrence of the back gate effect, and an electronic apparatus including the display device.

An embodiment of the present disclosure is directed to a display device including a plurality of light-emitting elements, each light-emitting element having a light-emitting unit and a driving circuit for driving the light-emitting unit. The driving circuit at least includes (A) a drive transistor having source/drain regions, a channel forming region, and a gate electrode, (B) a video signal write transistor having source/drain regions, a channel forming region, and a gate electrode, and (C) a capacitive unit. In the drive transistor, (A-1) one region of the source/drain regions is connected to the corresponding current supply line, (A-2) the other region of the source/drain regions is connected to the light-emitting unit and connected to one end of the capacitive unit, and forms a second node, and (A-3) the gate electrode is connected to the other region of the source/drain regions of the video signal write transistor and connected to the other end of the capacitive unit, and forms a first node. In the video signal write transistor, (B-1) one region of the source/drain regions is connected to the corresponding data line, and (B-2) the gate electrode is connected to the corresponding scanning line. The drive transistor is formed within a first conduction-type second well which is formed within a second conduction-type first well in a first conduction-type silicon semiconductor substrate, the video signal write transistor is formed in the first conduction-type silicon semiconductor substrate, and the other region of the source/drain regions of the drive transistor and the second well are electrically connected together.

Another embodiment of the present disclosure is directed to an electronic apparatus including the above-described display device according to the embodiment of the present disclosure.

In the display device according to the embodiment of the present disclosure or the display device of the electronic apparatus according to another embodiment of the present disclosure, the other region of the source/drain regions of the drive transistor and the second well are electrically connected together. For this reason, when the potential of the other region of the source/drain regions of the drive transistor rises or the voltage increases, the potential of the second well also rises or the voltage increases. Accordingly, it is possible to suppress the occurrence of the back gate effect (also referred to as a substrate bias effect), to attain stable operation of the driving circuit, and to suppress an increase in power consumption of the display device or the electronic apparatus.

BRIEF DESCRIPTION OF THE DRAWINGS

FIG. 1 is a schematic partial sectional view of a light-emitting element including a driving circuit in a display device of Example 1 or a display device of an electronic apparatus.

FIG. 6 is a schematic driving timing chart of a 5Tr/1C driving circuit of Example 3.

FIG. 9 is a conceptual diagram of a circuit which constitutes a display device of Example 4 or a display device of an electronic apparatus.

FIG. 16 is a schematic driving timing chart of a 3Tr/1C driving circuit of Example 5.

FIG. 21 is a schematic driving timing chart of a 2Tr/1C driving circuit of Examples 1 and 6.

DETAILED DESCRIPTION

Figure 2A:
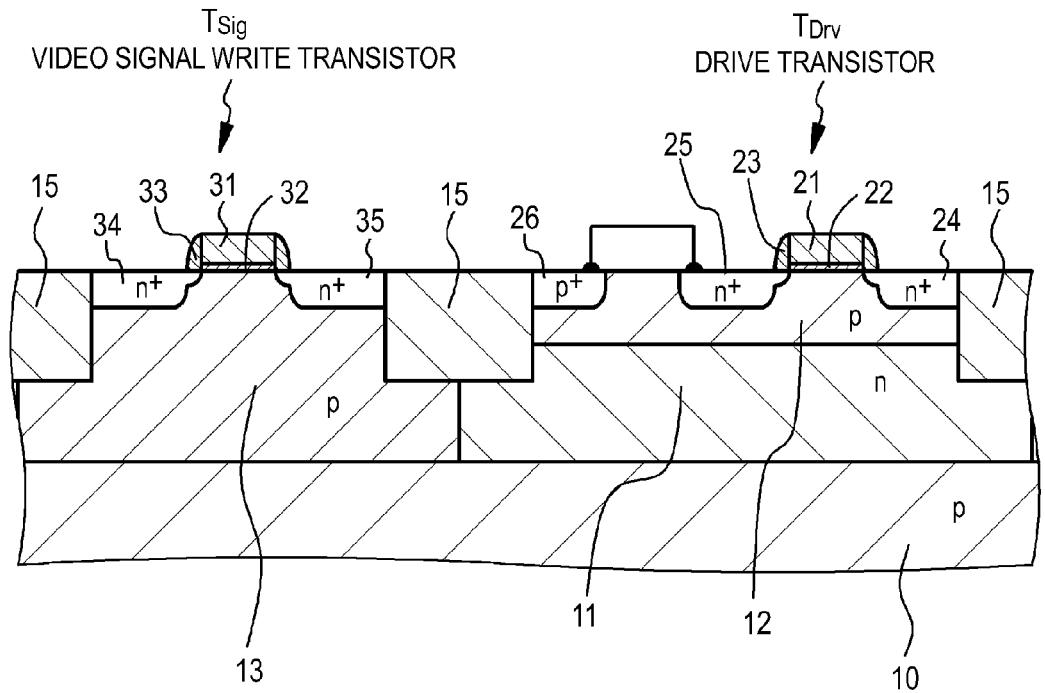
FIGS. 2A and 2B are respectively schematic partial sectional views of an extracted portion of a drive transistor and a video signal write transistor which constitute a driving circuit in a display device of Examples 1 and 2 or a display device of an electronic apparatus.

Although the present disclosure will be hereinafter described in connection with examples with reference to the drawings, the present disclosure is not limited to the examples, and various numerical values or materials in the examples are for illustration. The description will be provided in the following sequence.

1. Overall description of display device according to embodiment of present disclosure and electronic apparatus
2. Example 1 (display device according to embodiment of present disclosure and electronic apparatus)
3. Example 2 (Modification of Example 1)
4. Example 3 (Another modification of Example 1. 5Tr/1C driving circuit)
5. Example 4 (Another modification of Example 1. 4Tr/1C driving circuit)
6. Example 5 (Another modification of Example 1. 3Tr/1C driving circuit)
7. Example 6 (Another modification of Example 1. 2Tr/1C driving circuit) and others

[Overall Description of Display Device According to Embodiment of Present Disclosure and Electronic Apparatus]

In a display device according to an embodiment of the present disclosure or a display device of an electronic apparatus, a form in which a video signal write transistor is formed within a first conduction-type third well which is formed in a first conduction-type silicon semiconductor substrate, and a third well is at the same potential in all of the light-emitting elements can be made. In the display device according to the embodiment of the present disclosure or the display device of the electronic apparatus including this form, a form in which the first well is electrically isolated in each light-emitting element can be made.

Although a p type is used as a first conduction type and an n type is used as a second conduction type, the form is not limited to this. The first conduction type may be the n type and the second conduction type may be the p type.

In the display device according to the embodiment of the present disclosure or the display device of the electronic apparatus, current supply lines are connected to a current supply unit, data lines are connected to a video signal output circuit, and scanning lines are connected to a scanning circuit. The current supply unit, the video signal output circuit, and the scanning circuit are normally included in the display device.

The driving circuit may be, for example, a driving circuit (referred to as "2Tr/1C driving circuit") having two transistors (drive transistor and video signal write transistor) and one capacitive unit, a driving circuit (referred to as "3Tr/1C driving circuit") having three transistors (drive transistor, video signal write transistor, and one transistor) and one capacitive unit, a driving circuit (referred to as "4Tr/1C driving circuit") having four transistors (drive transistor, video signal write transistor, and two transistors) and one capacitive unit, or a driving circuit (referred to as "5Tr/1C driving circuit") having five transistors (drive transistor, video signal write transistor, and three transistors) and one capacitive unit. Specifically, the light-emitting unit may have an organic electroluminescence light-emitting unit (organic EL light-emitting unit). The other of the source/drain regions of the drive transistor and a second well are electrically connected together. Specifically, for example, a connection region of a first conduction type is provided in the surface region of the second well, the connection and the other region of the source/drain regions of the drive transistor are brought into contact with each other directly or through a conductive material layer. Alternatively, the connection region and the other region of the source/drain regions of the drive transistor may be electrically connected together through a contact hole, a wiring, and the like.

The display device according to the embodiments of the present disclosure or the display device of the electronic apparatus may have a configuration in which so-called monochrome display is performed or a configuration in which one pixel has a plurality of subpixels, specifically, one pixel has three subpixels of a red light-emitting subpixel, a green light-emitting subpixel, and a blue light-emitting subpixel. Each pixel may have a set of subpixels including these three kinds of subpixels and one kind of subpixel or a plurality of kinds of subpixels (for example, one set of subpixels including a subpixel which emits white light for improving luminance, one set of subpixels including a subpixel which emits complementary color light for expanding the color reproduction range, one set of subpixels including a subpixel which emits yellow light for expanding the color reproduction range, or one set of subpixels including subpixels which emit yellow and cyan light for expanding the color reproduction range).

In the display device according to the embodiments of the present disclosure or the display device of the electronic apparatus, various circuits, such as the current supply unit, the video signal output circuit, and the scanning circuits, various wirings, such as the current supply lines, the data lines, and the scanning lines, and the configuration or structure of the light-emitting unit may be the known configuration or structure. Specifically, for example, the light-emitting unit which is constituted by an organic EL light-emitting unit may have, for example, an anode electrode, an organic material layer (for example, having a structure in which a hole transport layer, a light-emitting layer, and an electron transport layer are laminated), a cathode electrode, and the like. The capacitive unit which constitutes the driving circuit may have one electrode, the other electrode, and a dielectric layer (insulating layer) interposed between these electrodes. The transistor and the capacitive unit which constitute the driving circuit are formed in a silicon semiconductor substrate, and the light-emitting unit is formed above the transistor and the capacitive unit constituting the driving circuit through an insulating interlayer, for example. The other of the source/drain regions of the drive transistor is connected to the anode electrode of the light-emitting unit through a contact hole, for example.

Example 1

Figure 19:
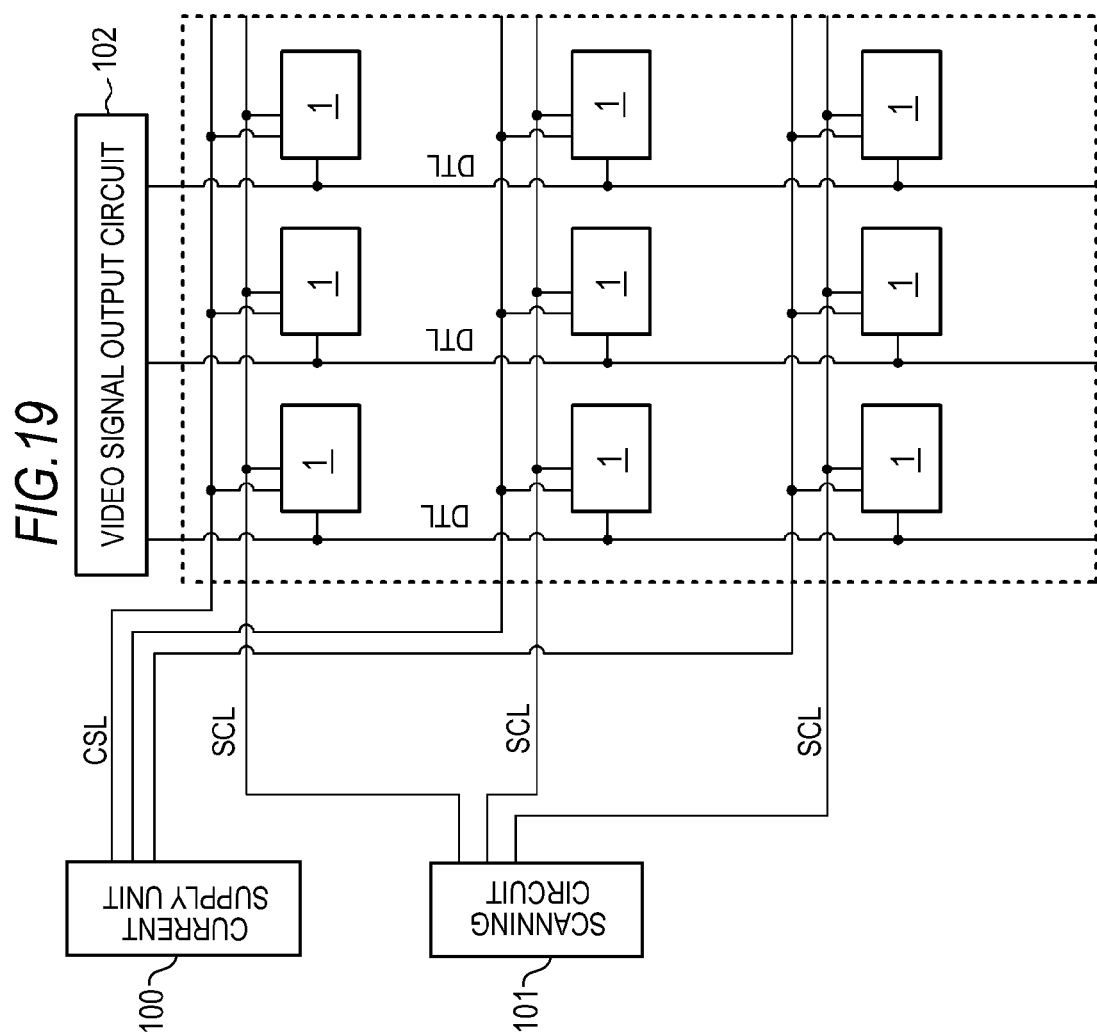
FIG. 19 is a conceptual diagram of a circuit which constitutes a display device of Examples 1 and 6 or a display device of an electronic apparatus.
Figure 20:
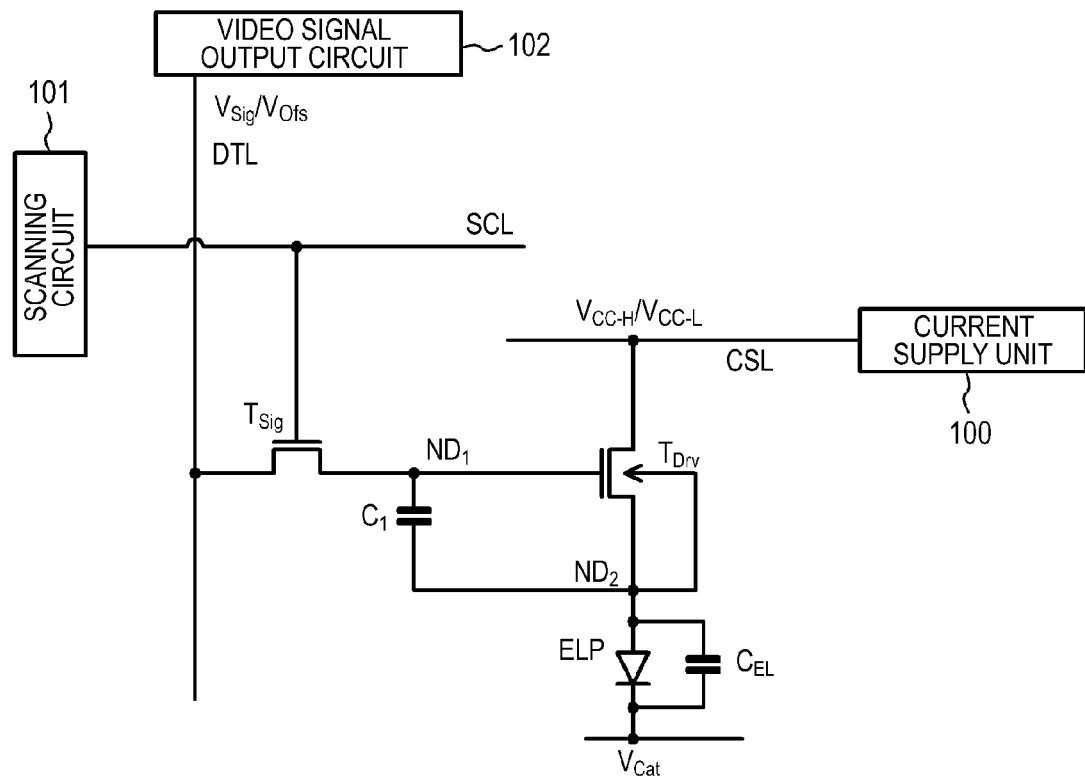
FIG. 20 is an equivalent circuit diagram of a 2Tr/1C driving circuit of Examples 1 and 6.

Example 1 relates to the display device according to the embodiment of the present disclosure and the electronic apparatus, and specifically, to an organic EL display device and an electronic apparatus including the organic EL display device. Hereinafter, the display device of each example and the display device of the electronic apparatus are collectively and simply referred to as "display device of example". FIG. 1 is a schematic partial sectional view of a light-emitting element including a driving circuit in the display device of Example 1. FIG. 2A is a schematic partial sectional view of an extracted portion of a drive transistor and a video signal write transistor which constitute the driving circuit. FIG. 20 is an equivalent circuit diagram of the light-emitting element including the driving circuit in the display device of Example 1 (an example in which the driving circuit is a driving circuit (2Tr/1C driving circuit) having two transistors $T_{Drv}$ and $T_{Sig}$ and one capacitive unit $C_1$). FIG. 19 is a conceptual diagram of a circuit which constitutes the display device. In the schematic partial sectional view of FIG. 1, for simplification of the drawing, a sectional view of the display device taken along a different vertical virtual plane is also included.

The display device of Example 1 is a display device which has a plurality of light-emitting elements 1. Each of the light-emitting elements 1 includes a light-emitting unit (specifically, organic EL light-emitting unit) ELP and a driving circuit for driving the light-emitting unit ELP.

The display device has N×M pixels arranged in a two-dimensional matrix. One pixel has three subpixels (a red light-emitting subpixel which emits red light, a green light-emitting subpixel which emits green light, and a blue light-emitting subpixel which emits blue light).

As shown in the conceptual diagram of the circuit of FIG. 19, the display device of Example 1 includes (a) a current supply unit 100, (b) a scanning circuit 101, (c) a video signal output circuit 102, (d) N×M light-emitting elements 1 in total of N light-emitting elements 1 in a first direction and M light-emitting elements 1 in a second direction (specifically, a direction perpendicular to the first direction) different from the first direction arranged in a two-dimensional matrix, (e) M current supply lines CSL which are connected to the current supply unit 100 and extend in the first direction, (f) M scanning lines SCL which are connected to the scanning circuit 101 and extend in the first direction, and (g) N data lines DTL which are connected to the video signal output circuit 102 and extend in the second direction. Although in FIG. 19, 3×3 light-emitting elements 1 are shown, this is merely for illustration. The current supply unit 100 or the scanning circuit 101 may be arranged at one end of the scanning line SCL or may be arranged at both ends.

The driving circuit at least includes (A) a drive transistor $T_{Drv}$ having source/drain regions, a channel forming region, and a gate electrode, (B) a video signal write transistor $T_{Sig}$ having source/drain regions, a channel forming region, and a gate electrode, and (C) a capacitive unit $C_1$. Specifically, the drive transistor $T_{Drv}$ and the video signal write transistor $T_{Sig}$ are MOSFETs.

In the drive transistor $T_{Drv}$, (A-1) one region 24 of the source/drain regions is connected to the corresponding current supply line CSL, (A-2) the other region 25 of the source/drain regions is connected to the light-emitting unit ELP and connected to one end of the capacitive unit $C_1$, and forms a second node $ND_2$, and (A-3) a gate electrode 21 is connected to the other region of the source/drain regions of the video signal write transistor $T_{Sig}$ and connected to the other end of the capacitive unit $C_1$, and forms a first node $ND_1$.

In the video signal write transistor $T_{Sig}$, (B-1) one region 34 of the source/drain regions is connected to the corresponding data line DTL, and (B-2) a gate electrode 31 is connected to the corresponding scanning line SCL.

The capacitive unit $C_1$ (in FIG. 1, indicated by an encircled portion) has one electrode 41, the other electrode 42, and a dielectric layer (insulating layer) 43 interposed between these electrodes 41 and 42. In the drive transistor $T_{Drv}$, one region of the source/drain regions (in this example, specifically, a source/drain region which functions as a drain region 24 at the time of light emission of the light-emitting unit. The same applies to the following description) is connected to the current supply unit 100. The other of the source/drain regions (in this example, specifically, a source/drain region which functions as a source region 25 at the time of light emission of the light-emitting unit. The same applies to the following description) is connected to an anode electrode 51 of the light-emitting unit (organic EL light-emitting unit) ELP and connected to the other electrode 42 of the capacitive unit $C_1$. The gate electrode 21 is connected to the other region of the source/drain regions (In this example, specifically, a source/drain region which functions as a source region 35 at the time of video signal writing. The same applies to the following description) of the video signal write transistor $T_{Sig}$ and connected to the one electrode 41 of the capacitive unit $C_1$, and forms a first node $ND_1$. In the video signal write transistor $T_{Sig}$, one region of the source/drain regions (in this example, specifically, at the time of video signal writing, the source/drain region functioning as a drain region 34. The same applies to the following description) is connected to the data line DTL, and the gate electrode 31 is connected to the scanning line SCL. Note that reference numeral 15 represents an isolation region, reference numerals 22 and 32 represent gate insulating layers, and reference numerals 23 and 33 represent gate sidewall.

The drain region 24 of the drive transistor $T_{Drv}$ is connected to the current supply unit 100 through a contact hole, a contact pad 70, and the current supply line CSL. The drain region 34 of the video signal write transistor $T_{Sig}$ is connected to the video signal output circuit 102 through another contact hole, another contact pad 70, and the data line DTL. The gate electrode 31 of the video signal write transistor $T_{Sig}$ is connected to the scanning circuit 101 through another contact hole, another contact pad 70, and the scanning line SCL. The other electrode 42 of the capacitive unit $C_1$ is connected to the anode electrode 51 of the light-emitting unit ELP through another contact hole and another contact pad 70. The contact hole and the contact pad 70 are provided so as to be not short-circuited with the scanning line SCL or the current supply line CSL extending in the first direction. FIG. 1 shows this state.

The drive transistor $T_{Drv}$ is formed within a first conduction-type (p-type) second well 12 which is formed within a second conduction-type (in this example, specifically, n-type) first well 11 formed in a first conduction-type (in this example, specifically, p-type) silicon semiconductor substrate 10. The video signal write transistor $T_{Sig}$ is formed within a first conduction-type (p-type) third well 13 which is formed in the first conduction-type (p-type) silicon semiconductor substrate 10. The other region (source region 25) of the source/drain regions of the drive transistor $T_{Drv}$ and the second well 12 are electrically connected together. Specifically, a connection region 26 of a first conduction type (p+) is formed in the surface region of the second well 12. The connection region 26 and the other region 25 of the source/drain regions of the drive transistor $T_{Drv}$ are electrically connected through a contact hole 71, a wiring, and the like (specifically, the other electrode 42 of the capacitive unit $C_1$).

The third well 13 is at the same potential in all of the light-emitting elements. Specifically, the third well 13 is at a first predetermined potential (for example, ground potential) through the silicon semiconductor substrate 10. The first well 11 is electrically isolated in each light-emitting element 1. Specifically, the drive transistor $T_{Drv}$ which constitutes each light-emitting element 1 is surrounded by an isolation region 15, and the first well 11 is surrounded by a p-type semiconductor layer which is constituted by the p-type silicon semiconductor substrate 10. The first well 11 functions as a guard ring with respect to the second well 12. The first well 11 is a second predetermined potential (for example, a power supply potential) through a wiring (not shown).

Figure 3:
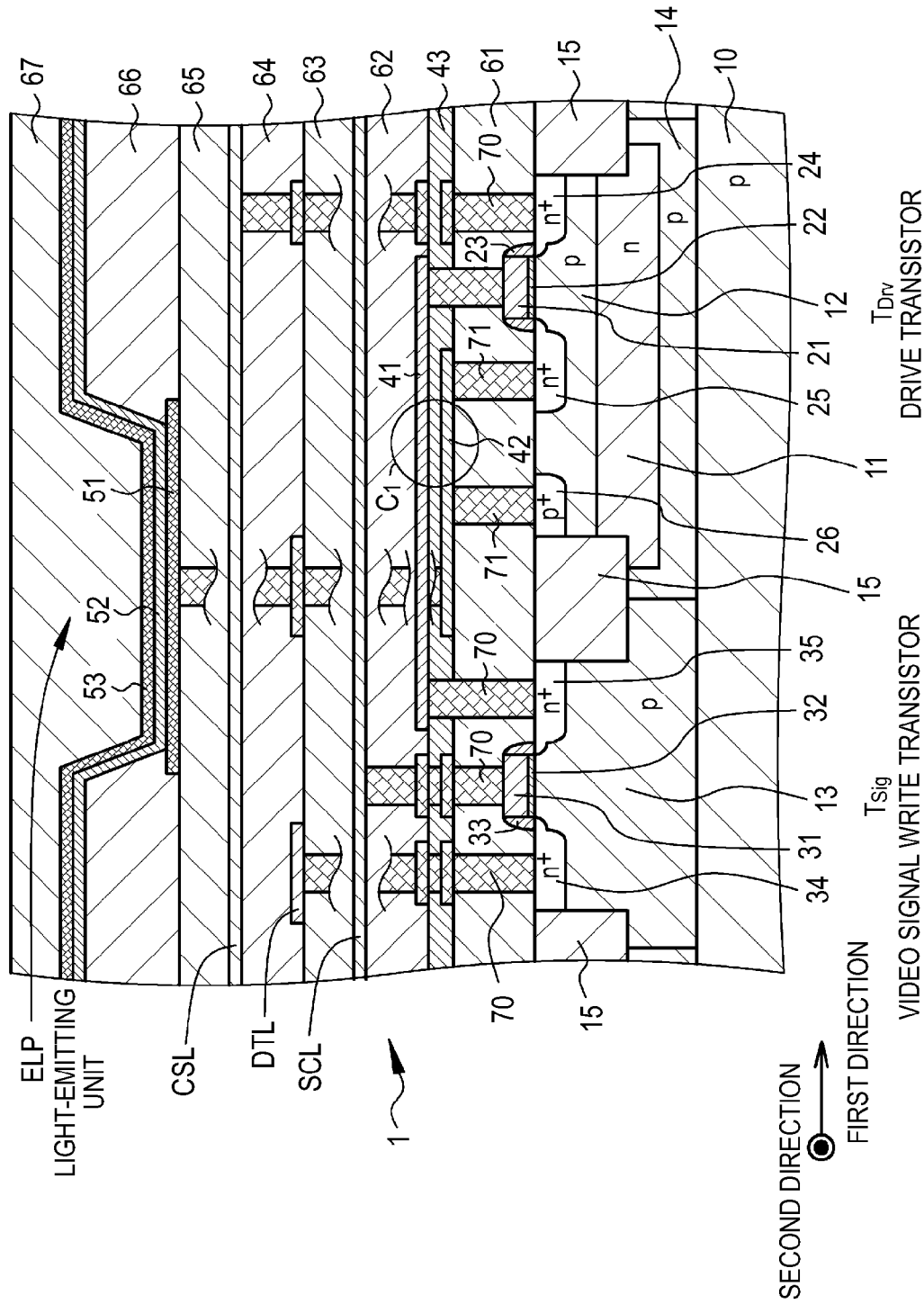
FIG. 3 is a schematic partial sectional view of a light-emitting element including a modification of a driving circuit in a display device of Example 1 or a display device of an electronic apparatus.

As shown in FIG. 3 which is a schematic partial sectional view of a light-emitting element including a modification of a driving circuit in the display device of Example 1. A well (fourth well 14) of a first conduction type (p type) which is the same as the third well 13 may be formed in a region of the silicon semiconductor substrate 10 where the drive transistor $T_{Drv}$ is to be formed simultaneously with the formation of the third well 13, and the first well 11 and the second well 12 may be provided within the first conduction type (p-type) fourth well 14.

Alternatively, in other words, the display device of Example 1 has a plurality of light-emitting elements, each light-emitting element having a light-emitting unit and a driving circuit for driving the light-emitting unit. The driving circuit at least includes a light-emitting unit ELP, a capacitive unit $C_1$, a video signal write transistor $T_{Sig}$ which is constituted by a MOSFET and holds a driving signal (luminance signal) $V_{Sig}$ in the capacitive unit $C_1$, and a drive transistor $T_{Drv}$ which is constituted by a MOSFET and drives the light-emitting unit ELP on the basis of the driving signal (luminance signal) $V_{Sig}$ held in the capacitive unit $C_1$. The drive transistor $T_{Drv}$ is formed within a first conduction-type second well 12 which is formed within a second conduction-type first well 11 formed in a first conduction-type silicon semiconductor substrate 10, the video signal write transistor $T_{Sig}$ is formed in the first conduction-type silicon semiconductor substrate 10, and the other region of the source/drain regions of the drive transistor $T_{Drv}$ and the second well 12 are electrically connected together.

The drive transistor $T_{Drv}$ and the video signal write transistor $T_{Sig}$ provided in the silicon semiconductor substrate 10 are covered with an insulating interlayer 61. The other electrode 42 and the dielectric layer (insulating layer) 43 of the capacitive unit $C_1$ are formed on the insulating interlayer 61, and one electrode 41 of the capacitive unit $C_1$ is formed on the dielectric layer (insulating layer) 43. An insulating interlayer 62 is formed on the dielectric layer (insulating layer) 43 and one electrode 41 of the capacitive unit $C_1$, and a scanning line SCL is formed on the insulating interlayer 62. An insulating interlayer 63 is formed on the insulating interlayer 62 and the scanning line SCL, and a data line DTL is formed on the insulating interlayer 63. An insulating interlayer 64 is formed on the insulating interlayer 63 and the data line DTL, and a current supply line CSL is formed on the insulating interlayer 64. An insulating interlayer 65 is formed on the insulating interlayer 64 and the current supply line CSL, and an anode electrode 51 constituting the light-emitting unit ELP is formed on the insulating interlayer 65. An insulating interlayer 66 having an opening with the anode electrode 51 exposed at the bottom thereof is formed on the insulating interlayer 65 and the anode electrode 51, a hole transport layer, a light-emitting layer, an electronic transport layer (an organic material layer 52 having a laminated structure of these layers), and a cathode electrode 53 constituting the light-emitting unit ELP are formed on the insulating interlayer 66 and the anode electrode 51, and an insulating layer 67 is formed on the cathode electrode 53. A glass plate (not shown) is bonded onto the insulating layer 67 through an adhesive layer (not shown). In some cases, it is not necessary to perform patterning of the organic material layer 52 and the cathode electrode 53. The lamination sequence of the scanning line SCL, the data line DTL, and the current supply line CSL is not limited to the above-described lamination sequence, and is intrinsically arbitrary.

The light-emitting element 1 described above may be manufactured by a known method, and various materials which are used when manufacturing the light-emitting element 1 may be known materials.

The operation of the driving circuit of Example 1 will be described in Example 6 described below.

In the display device of Example 1, since the other region of the source/drain regions of the drive transistor constituting the driving circuit and the second well are electrically connected together, when the potential of the other region of the source/drain regions of the drive transistor rises or the voltage increases, the potential of the second well also rises or the voltage increases. Accordingly, it is possible to suppress the occurrence of the back gate effect, to attain stable operation of the driving circuit, and to suppress an increase in power consumption of the display device. Although in the related art technique, it is necessary to sequence a wide signal dynamic range of the driving signal (luminance signal) $V_{Sig}$ for controlling luminance in the light-emitting unit ELP described below, in the driving circuit according to the embodiment of the present disclosure, it becomes possible to set a narrow signal dynamic range and to suppress a charge/discharge current of the data line, thereby contributing to low power consumption of the display device. Since the other region of the source/drain regions of the drive transistor and the second well are electrically connected together, when the light-emitting unit ELP is deteriorated, the I-V characteristic of the light-emitting unit ELP is deteriorated. Therefore, even when the potential of the anode electrode is higher, no problems occur.

Example 2

Figure 2B:
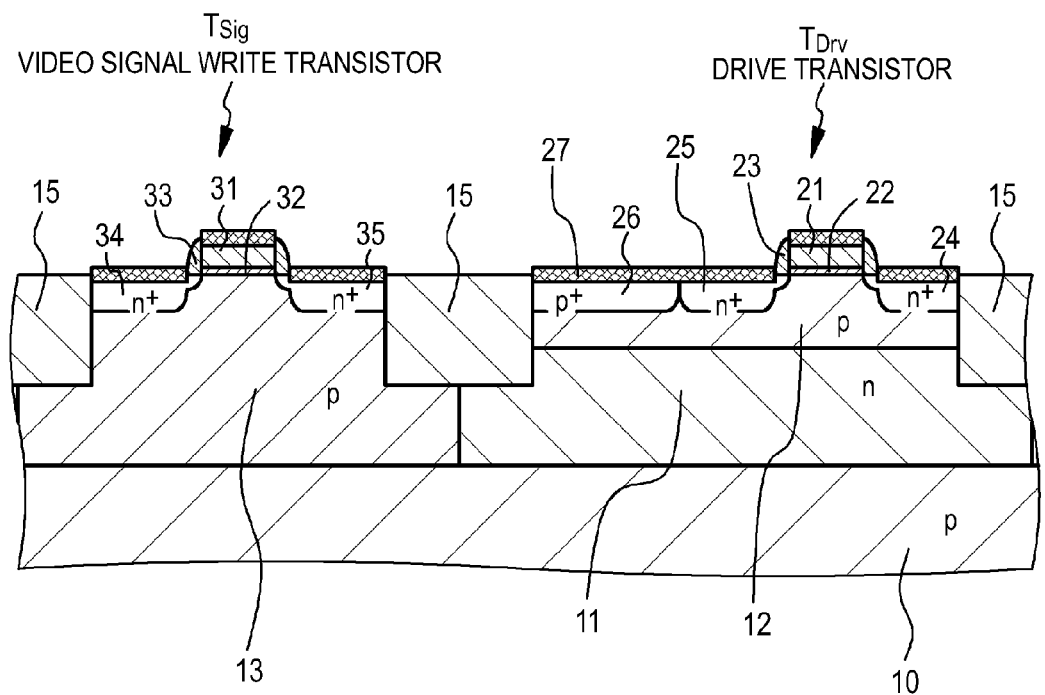

Example 2 is a modification of Example 1. FIG. 2B is a schematic partial sectional view of an extracted portion of a drive transistor and a video signal write transistor which constitute a driving circuit in a display device of Example 2.

In Example 2, as in Example 1, a connection region 26 of a first conduction type (p+) is provided in the surface region of the second well 12. A difference from Example 1 is that a conductive material layer 27 (specifically, metal silicide layer) is formed on the surfaces of the connection region 26 and the source region 25. With this configuration, it is possible to reliably electrically connect the other region (source region 25) of the source/drain regions of the drive transistor $T_{Drv}$ and the second well together.

Specifically, the conductive material layer 27 can be formed by a SALICIDE (Self-ALIgned SiliCIDE) process. That is, after the formation of the gate insulating layer 22 of the drive transistor $T_{Drv}$, the formation of the gate electrode 21, ion implantation for forming an LDD structure, the formation of a gate sidewall 23, the formation of the source/drain regions 24 and 25 based on ion implantation, and the formation of the connection region 26 based on the ion implantation, a metal layer (for example, cobalt layer) is formed on the entire surface. Thermal treatment is performed, and silicon atoms in the silicon semiconductor substrate 10 react with metal atoms in the metal layer to form a metal silicide layer. Thus, the conductive material layer 27 is formed. At this time, a metal silicide layer may be formed on the top surface of the gate electrode 21. Thereafter, the metal layer which does not react with silicon atoms is removed, and the metal silicide layer is annealed to stabilize the metal silicide layer. In this way, it is possible to obtain the conductive material layer 27 which reliably electrically connect the other region (source region 25) of the source/drain regions of the drive transistor $T_{Drv}$ and the second well together.

Example 3

In Example 3 or Examples 4 to 6 described below, the operation of the driving circuit according to the embodiment of the present disclosure is performed. The outline of a method of driving a driving circuit in Example 3 or Examples 4 to 6 described below is as follows, for example. That is, the method of driving a driving circuit includes the steps of (a) performing a preprocess for applying a first node initialization voltage to the first node $ND_1$ and applying a second node initialization voltage to the second node $ND_2$ such that the potential difference between the first node $ND_1$ and the second node $ND_2$ exceeds the threshold voltage $V_{th}$ of the drive transistor $T_{Drv}$, and the potential difference between the second node $ND_2$ and the cathode electrode of the light-emitting unit ELP does not exceed the threshold voltage $V_{th\text{-}EL}$ of the light-emitting unit ELP, (b) setting the potential of the drain region of the drive transistor $T_{Drv}$ to be higher than the potential of the second node $ND_2$ in the step (a) in a state where the potential of the first node $ND_1$ is held to increase the potential of the second node $ND_2$ and performing a threshold voltage cancel process for bringing the potential difference between the first node $ND_1$ and the second node $ND_2$ close to the threshold voltage $V_{th}$ of the drive transistor $T_{Drv}$, (c) performing a write process for applying a video signal voltage from the data line DTL to the first node $ND_1$ through the video signal write transistor $T_{Sig}$ which becomes the on state in response to a signal from the scanning line SCL and placing the drive transistor $T_{Drv}$ in the on state, (d) placing the video signal write transistor $T_{Sig}$ in the off state in response to a signal from the scanning line SCL to place the first node $ND_1$ in the floating state, and (e) allowing a current based on the value of the potential difference between the first node $ND_1$ and the second node ND$_2$ to flow into the light-emitting unit ELP from the current supply unit 100 through the drive transistor T$_{Drv}$ to drive the light-emitting unit ELP.

As described above, in the step (b), the threshold voltage cancel process is performed in which the potential difference between the first node and the second node is brought close to the threshold voltage of the drive transistor. Qualitatively, in the threshold voltage cancel process, how much the potential difference between the first node ND$_1$ and the second node ND$_2$ (in other words, the potential difference V$_{gs}$ between the gate electrode 22 and the source region 25 of the drive transistor T$_{Drv}$) is brought close to the threshold voltage V$_{th}$ of the drive transistor T$_{Drv}$ depends on the time of the threshold voltage cancel process. Accordingly, for example, in a form in which a sufficient time for the threshold voltage cancel process is secured, the potential difference between the first node ND$_1$ and the second node ND$_2$ reaches the threshold voltage V$_{th}$ of the drive transistor T$_{Drv}$, and the drive transistor T$_{Drv}$ is placed in the off state. In a form in which the time of the threshold voltage cancel process just has to be set to be short, the potential difference between the first node ND$_1$ and the second node ND$_2$ is greater than the threshold voltage V$_{th}$ of the drive transistor T$_{Drv}$, and the drive transistor T$_{Drv}$ may not be placed in the off state. As a result of the threshold voltage cancel process, it is not necessary that the drive transistor T$_{Drv}$ is placed in the off state.

It is assumed that the light-emitting elements which constitute each pixel are line-sequentially driven, and a display frame rate is FR (times/second). That is, the light-emitting elements which constitute each of N pixels (3×N subpixels) arranged in the m-th (where m=1, 2, 3, . . . , and M) row are driven simultaneously. In other words, in each of the light-emitting elements which constitute one row, the light-emission/non-light-emission timing is controlled in terms of rows to which these light-emitting elements belong. A process for writing a video signal to each pixel constituting one row may be a process (simultaneous write process) for writing a video signal to all pixels simultaneously, or a process (sequential write process) for sequentially writing a video signal to each pixel. These write processes may be appropriately selected in accordance with the configuration of the light-emitting element or the driving circuit.

Hereinafter, the driving or operation of a light-emitting element which constitutes one subpixel in a pixel in the m-th row and the n-th column (where n=1, 2, 3, . . . , and N) will be described. A relevant subpixel or light-emitting element is hereinafter referred to as the (n,m)th subpixel or the (n,m)th light-emitting element. Various processes (a threshold voltage cancel process, a write process, and a mobility correction process described below) are performed until the horizontal scanning period (the m-th horizontal scanning period) of each light-emitting element arranged in the m-th row ends. It is necessary that the write process or the mobility correction process is performed within the m-th horizontal scanning period. The threshold voltage cancel process or the associated preprocess may be performed ahead of the m-th horizontal scanning period depending on the type of light-emitting element or driving circuit.

After various processes described above end, the light-emitting unit which constitute each light-emitting element arranged in the m-th row emits light. The light-emitting unit may emit light immediately or when a predetermined period (for example, horizontal scanning periods for a predetermined number of rows) elapses after various processes described above end. The predetermined period may be appropriately set in accordance with the specification of the display device, the configuration of the light-emitting element or the driving circuit, or the like. In the following description, for convenience of description, it is assumed that the light-emitting unit emits light immediately after various processes end. Light emission of the light-emitting unit which constitutes each light-emitting element arranged in the m-th row continues immediately before the start of the horizontal scanning period of each light-emitting element arranged in the (m+m')th row. "m'" is determined the design specification of the display device. That is, light emission of the light-emitting unit which constitutes each light-emitting element arranged in the m-th row in a certain display frame continues up to the (m+m'−1)th horizontal scanning period. The light-emitting unit which constitutes each light-emitting element arranged in the m-th row is maintained in the non-light-emission state from the beginning of the (m+m')th horizontal scanning period until the write process or the mobility correction process is completed within the m-th horizontal scanning period in the next display frame. If the period (hereinafter, simply referred to as a non-light-emission period) of the above-described non-light-emission state is provided, afterimage blurring due to active matrix driving can be reduced, and excellent motion image quality can be obtained. The light-emission state/non-light-emission state of each subpixel (light-emitting element) is not limited to the state described above. The time length of the horizontal scanning period is the time length smaller than (1/FR)×(1/M). When the value of (m+m') exceeds M, the horizontal scanning period for the excess is processed in the next display frame.

In the following description, of the two source/drain regions of one transistor, the term "one region of the source/drain regions" means the source/drain region which is connected to the current supply unit or a power supply unit. When a transistor is in the on state, this means a state where a channel is formed between the source/drain regions. It does not matter whether a current flows from one region of the source/drain regions of a certain transistor to the other region of the source/drain regions. When a transistor is in the off state, this means a state where a channel is not formed between the source/drain regions. When the source/drain regions of a certain transistor are connected to the source/drain regions of another transistor, this includes a form in which the source/drain regions of the certain transistor and the source/drain regions of another transistor occupy the same region. The source/drain regions may be formed of a conductive material, such as polysilicon or amorphous silicon containing an impurity, or may be formed of metal, alloy, conductive particles, a laminated structure thereof, or a layer made of an organic material (conductive polymer). In a timing chart which is used in the following description, the length (time length) of the horizontal axis which represents each period is schematically shown, and is not intended to represent the ratio of the time length of each period.

Figure 4:
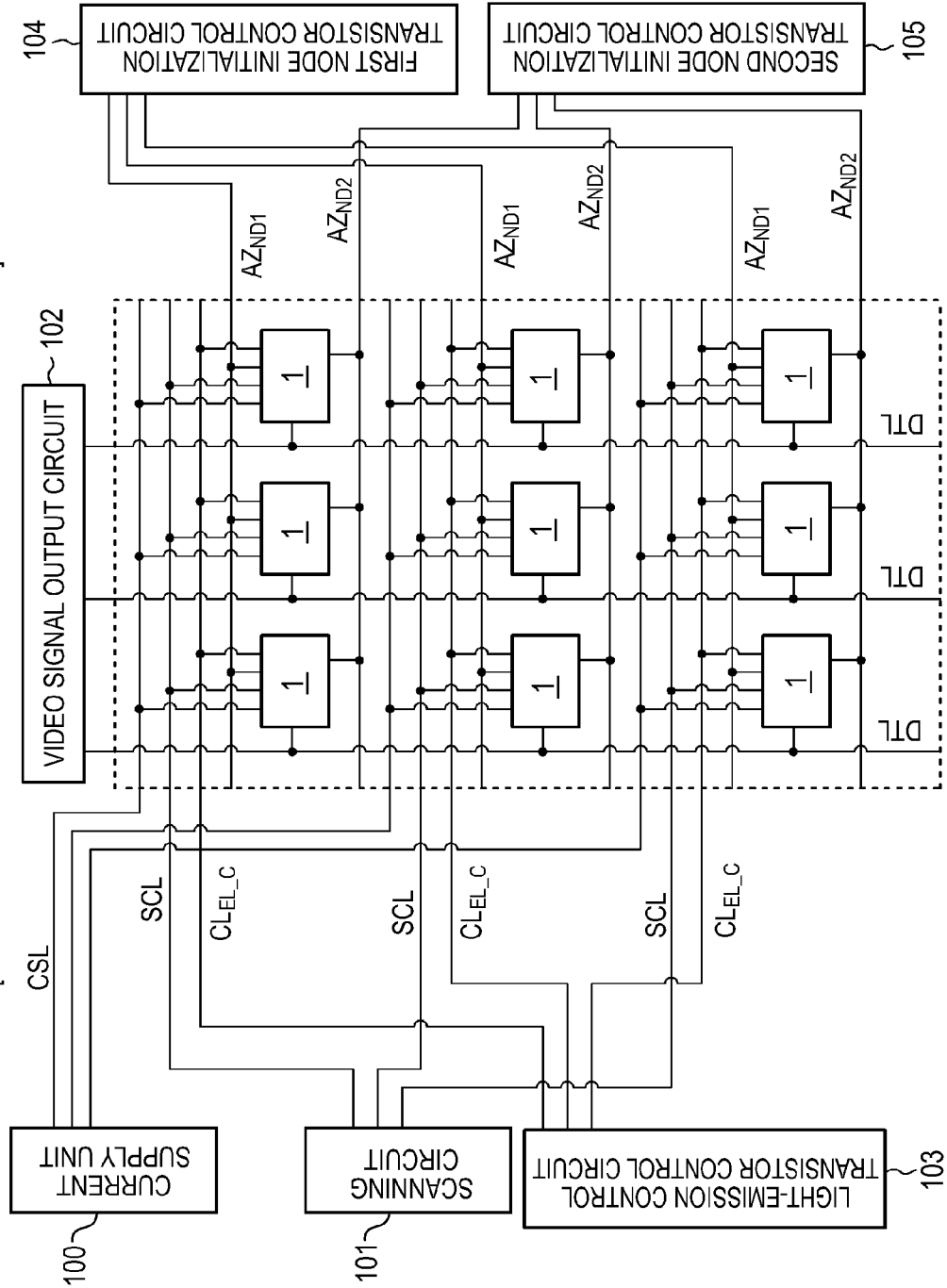
FIG. 4 is a conceptual diagram of a circuit which constitutes a display device of Example 3 or a display device of an electronic apparatus.
Figure 5:
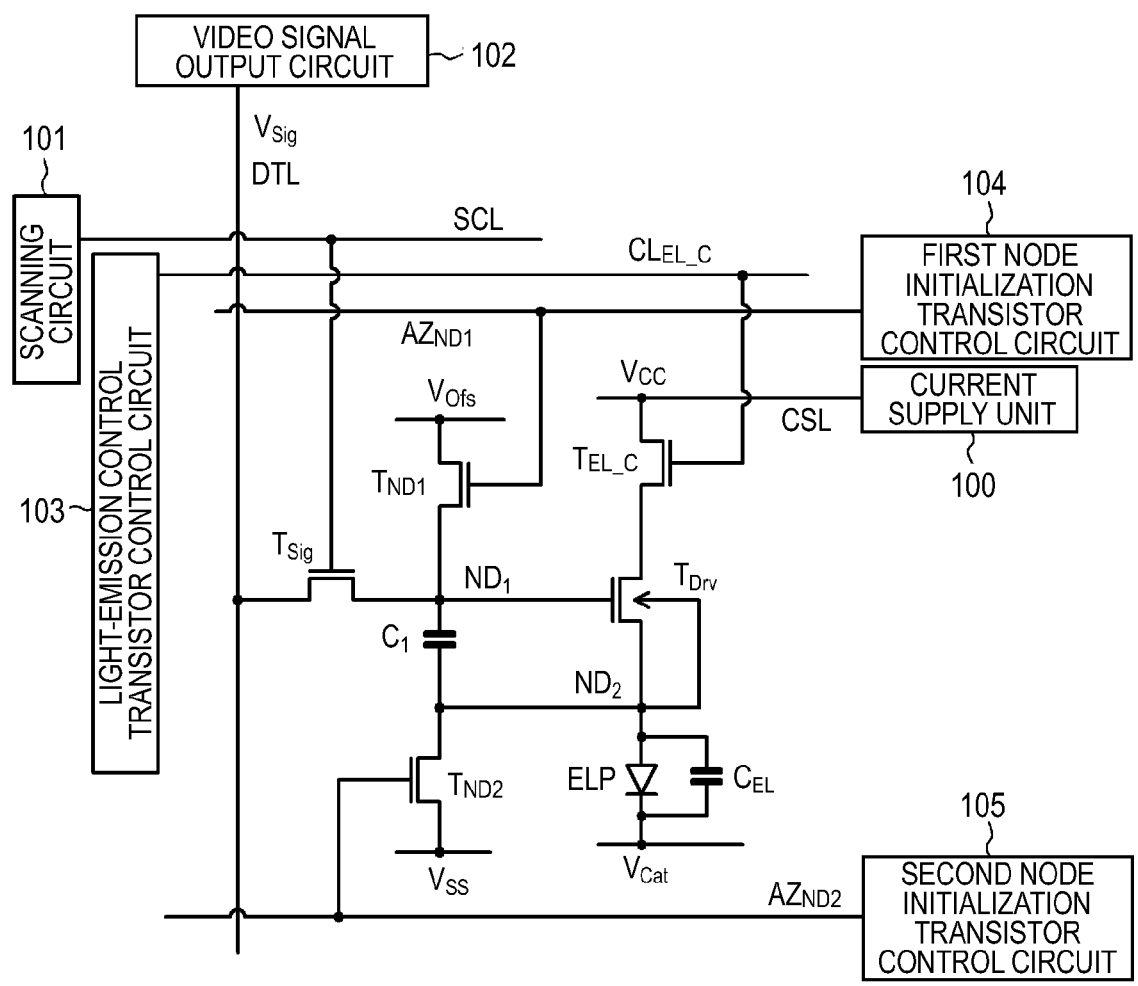
FIG. 5 is an equivalent circuit diagram of a 5Tr/1C driving circuit of Example 3.

Specifically, the driving circuit of Example 3 is a driving circuit (5Tr/1C driving circuit) having five transistors and one capacitive unit C$_1$. FIG. 4 is a conceptual diagram of a circuit which constitutes the display device of Example 3. FIG. 5 is an equivalent circuit diagram of a 5Tr/1C driving circuit. FIG. 6 is a schematic driving timing chart. FIGS. 7A to 7D and 8A to 8E schematically show the on/off state and the like of each transistor. In FIGS. 7A to 7D, 8A to 8E, and 12A to 12D, 13A to 13D, 17A to 17D, 18A to 18E, and 22A to 22F described below, electrical connection of the other region of the source/drain regions of the drive transistor and the second well is not shown.

The 5Tr/1C driving circuit has five transistors of the video signal write transistor $T_{Sig}$ and the drive transistor $T_{Drv}$ described in Example 1 or 2, a light-emission control transistor $T_{EL\_C}$, a first node initialization transistor $T_{ND1}$, a second node initialization transistor $T_{ND2}$, and one capacitive unit $C_1$.

[Light-Emission Control Transistor $T_{EL\_C}$]

One of the source/drain regions of the light-emission control transistor $T_{EL\_C}$ is connected to the current supply unit (voltage $V_{CC}$) 100, and the other region of the source/drain regions of the light-emission control transistor $T_{EL\_C}$ is connected to one region of the source/drain regions of the drive transistor $T_{Drv}$. The on/off operation of the light-emission control transistor $T_{EL\_C}$ is controlled by a light-emission control transistor control line $CL_{EL\_C}$ connected to the gate electrode of the light-emission control transistor $T_{EL\_C}$.

[Drive Transistor $T_{Drv}$]

As described above, one region of the source/drain regions of the drive transistor $T_{Drv}$ is connected to the other region of the source/drain regions of the light-emission control transistor $T_{EL\_C}$. That is, the drive transistor $T_{Drv}$ is connected to the current supply unit 100 through the light-emission control transistor $T_{EL\_C}$. The other of the source/drain regions of the drive transistor $T_{Drv}$ is connected to (1) the anode electrode of the light-emitting unit ELP, (2) the other region of the source/drain regions of the second node initialization transistor $T_{ND2}$, and (3) one electrode of the capacitive unit $C_1$, and forms a second node $ND_2$. The gate electrode of the drive transistor $T_{Drv}$ is connected to (1) the other region of the source/drain regions of the video signal write transistor $T_{Sig}$, (2) the other region of the source/drain regions of the first node initialization transistor $T_{ND1}$, and (3) the other electrode of the capacitive unit $C_1$, and forms a first node $ND_1$.

In the light-emission state of the light-emitting unit ELP, the drive transistor $T_{Drv}$ is driven such that a drain current $I_{ds}$ flows in accordance with Expression (1). In the light-emission state of the light-emitting unit ELP, one region of the source/drain regions of the drive transistor $T_{Drv}$ operates as a drain region, and the other region of the source/drain regions operates as a source region. As described in Example 1, hereinafter, one region of the source/drain regions of the drive transistor $T_{Drv}$ is simply referred to as a drain region, and the other region of the source/drain regions is simply referred to as a source region.

μ: effective mobility
L: channel length
W: channel width
$V_{gs}$: potential difference between gate electrode and source region
$V_{th}$: threshold voltage
$C_{ox}$: (relative dielectric constant of gate insulating layer)×(dielectric constant of vacuum)/(thickness of gate insulating layer)

$$k \equiv (1/2) \cdot (W/L) \cdot C_{ox}$$

$$I_{ds} = k \cdot \mu \cdot (V_{gs} - V_{th})^2 \quad (1)$$

If the drain current $I_{ds}$ flows in the light-emitting unit ELP, the light-emitting unit ELP emits light. The light-emission state (luminance) of the light-emitting unit ELP is controlled depending on the magnitude of the value of the drain current $I_{ds}$.

[Video Signal Write Transistor $T_{Sig}$]

As described in Example 1, the other region of the source/drain regions of the video signal write transistor $T_{Sig}$ is connected to the gate electrode of the drive transistor $T_{Drv}$. One of the source/drain regions of the video signal write transistor $T_{Sig}$ is connected to the data line DTL. A driving signal (luminance signal) $V_{Sig}$ for controlling luminance of the light-emitting unit ELP is supplied from the video signal output circuit 102 to one region of the source/drain regions through the data line DTL. Various signals/voltages (a signal for precharge driving, various reference voltages, and the like) other than $V_{Sig}$ may be supplied to one region of the source/drain regions through the data line DTL. The on/off operation of the video signal write transistor $T_{Sig}$ is controlled by the scanning line SCL connected to the gate electrode of the video signal write transistor $T_{Sig}$.

[First Node Initialization Transistor $T_{ND1}$]

As described above, the other region of the source/drain regions of the first node initialization transistor $T_{ND1}$ is connected to the gate electrode of the drive transistor $T_{Drv}$. A voltage $V_{Ofs}$ for initializing the potential of the first node $ND_1$ (that is, the potential of the gate electrode of the drive transistor $T_{Drv}$) is supplied to one region of the source/drain regions of the first node initialization transistor $T_{ND1}$. The on/off operation of the first node initialization transistor $T_{ND1}$ is controlled by a first node initialization transistor control line $AZ_{ND1}$ connected to the gate electrode of the first node initialization transistor $T_{ND1}$. The first node initialization transistor control line $AZ_{ND1}$ is connected to a first node initialization transistor control circuit 104.

[Second Node Initialization Transistor $T_{ND2}$]

As described above, the other region of the source/drain regions of the second node initialization transistor $T_{ND2}$ is connected to the source region of the drive transistor $T_{Drv}$. A voltage $V_{SS}$ for initializing the potential of the second node $ND_2$ (that is, the potential of the source region of the drive transistor $T_{Drv}$) is supplied to one region of the source/drain regions of the second node initialization transistor $T_{ND2}$. The on/off operation of the second node initialization transistor $T_{ND2}$ is controlled by a second node initialization transistor control line $AZ_{ND2}$ connected to the gate electrode of the second node initialization transistor $T_{ND2}$. The second node initialization transistor control line $AZ_{ND2}$ is connected to a second node initialization transistor control circuit 105.

[Light-Emitting Unit ELP]

As described above, the anode electrode of the light-emitting unit ELP is connected to the source region of the drive transistor $T_{Drv}$. A voltage $V_{Cat}$ is applied to the cathode electrode of the light-emitting unit ELP. The parasitic capacitance of the light-emitting unit ELP is represented by reference numeral $C_{EL}$. It is assumed that a threshold voltage which is required for light emission of the light-emitting unit ELP is $V_{th\text{-}EL}$. That is, if a voltage equal to or higher than $V_{th\text{-}EL}$ is applied between the anode electrode and the cathode electrode of the light-emitting unit ELP, the light-emitting unit ELP emits light.

Although in the following description, the values of the voltages or potentials are as follows, these values are just for illustration, and the voltages or potentials are not limited to these values.

$V_{Sig}$: driving signal (luminance signal) for controlling luminance of light-emitting unit ELP 0 volt to 10 volt $V_{CC}$: voltage of current supply unit for controlling light emission of light-emitting unit ELP . . . 20 volt $V_{Ofs}$: voltage for initializing potential of gate electrode of drive transistor $T_{Drv}$ (potential of first node $ND_1$) . . . 0 volt $V_{SS}$: voltage for initializing potential of source region of drive transistor $T_{Drv}$ (potential of second node $ND_2$) . . . −10 volt $V_{th}$: threshold voltage of drive transistor $T_{Drv}$ . . . 3 volt $V_{Cat}$ voltage applied to cathode electrode of light-emitting unit ELP . . . 0 volt $V_{th-EL}$: threshold voltage of light-emitting unit ELP . . . 3 volt Hereinafter, the operation of the 5Tr/1C driving circuit will be described. As described above, although a case where the light-emission state starts immediately after various processes (threshold voltage cancel process, write process, and mobility correction process) are completed will be described, the form is not limited to this. The same applies to a 4Tr/1C driving circuit, a 3Tr/1C driving circuit, and a 2Tr/1C driving circuit described below.

Figure 7A:
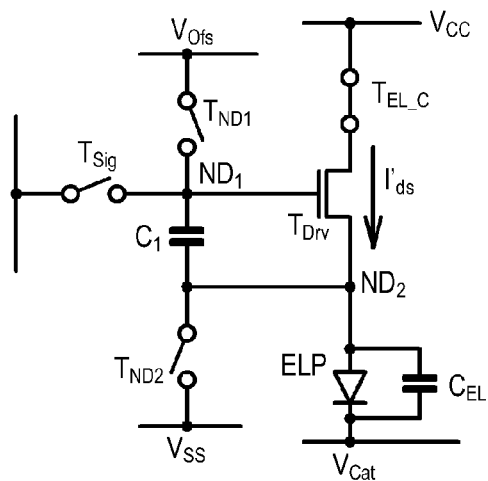
FIGS. 7A to 7D are diagrams schematically showing the on/off state and the like of each transistor which constitutes a 5Tr/1C driving circuit of Example 3.

[Period-TP(5)$_{-1}$] (See FIG. 6 and FIG. 7A)

[Period-TP(5)$_{-1}$] is, for example, the operation in the previous display frame, and the period in which the (n,m)th light-emitting unit ELP is in the light-emission state after various previous processes are completed. That is, a drain current I'$_{ds}$ based on Expression (5) flows in the light-emitting unit ELP which constitutes the (n,m)th subpixel, and luminance of the light-emitting unit ELP which constitutes the (n,m)th subpixel has a value corresponding to the relevant drain current I'$_{ds}$. The video signal write transistor $T_{Sig}$, the first node initialization transistor $T_{ND1}$, and the second node initialization transistor $T_{ND2}$ are in the off state, and the light-emission control transistor $T_{EL\_C}$ and the drive transistor $T_{Drv}$ are in the on state. The light-emission state of the (n,m)th light-emitting unit ELP continues immediately before the start of the horizontal scanning period of the light-emitting unit ELP arranged in the (m+m')th row.

[Period-TP(5)$_0$] to [Period-TP(5)$_4$] shown in FIG. 6 are the operation period from when the light-emission state ends after various previous processes are completed immediately before the next write process is performed. That is, [Period-TP(5)$_0$] to [Period-TP(5)$_4$] is the period of a certain time length from the start of the (m+m')th horizontal scanning period in the previous display frame until the end of the (m−1)th horizontal scanning period in the current display frame. [Period-TP(5)$_1$] to [Period-TP(5)$_4$] may be included within the m-th horizontal scanning period in the current display frame.

In [Period-TP(5)$_0$] to [Period-TP(5)$_4$], the (n,m)th light-emitting unit ELP is in the non-light-emission state. That is, in [Period-TP(5)$_0$] to [Period-TP(5)$_1$] and [Period-TP(5)$_3$] to [Period-TP(5)$_4$], since the light-emission control transistor $T_{EL\_C}$ is in the off state, the light-emitting unit ELP does not emit light. In [Period-TP(5)$_2$], the light-emission control transistor $T_{EL\_C}$ is placed in the on state. However, in this period, a threshold voltage cancel process described below is performed. Although the threshold voltage cancel process will be described below in detail, if it is assumed that Expression (2) is satisfied, the light-emitting unit ELP does not emit light.

Hereinafter, each period of [Period-TP(5)$_0$] to [Period-TP(5)$_4$] will be first described. Note that the length of the beginning of [Period-TP(5)$_1$] or each period of [Period-TP(5)$_1$] to [Period-TP(5)$_4$] may be appropriately set in accordance with design for a display device.

[Period-TP(5)$_0$]

As described above, in [Period-TP(5)$_0$], the (n,m)th light-emitting unit ELP is in the non-light-emission state. The video signal write transistor $T_{Sig}$, the first node initialization transistor $T_{ND1}$ and the second node initialization transistor $T_{ND2}$ are in the off state. At the time of change from [Period-TP(5)$_{-1}$] to [Period-TP(5)$_0$] since the light-emission control transistor $T_{EL\_C}$ is placed in the off state, the potential of the second node ND$_2$ (the source region of the drive transistor $T_{Drv}$ or the anode electrode of the light-emitting unit ELP) drops down to ($V_{th-EL}+V_{Cat}$), and the light-emitting unit ELP is placed in the non-light-emission state. In order to follow the potential drop of the second node ND$_2$, the potential of the first node ND$_1$ (the gate electrode of the drive transistor $T_{Drv}$) in the floating state also drops.

Figure 7B:
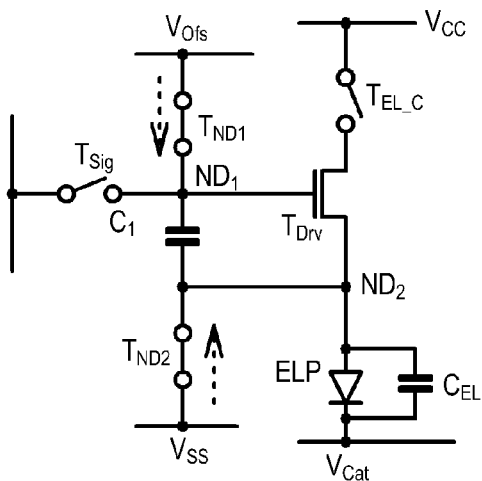
Figure 7C:
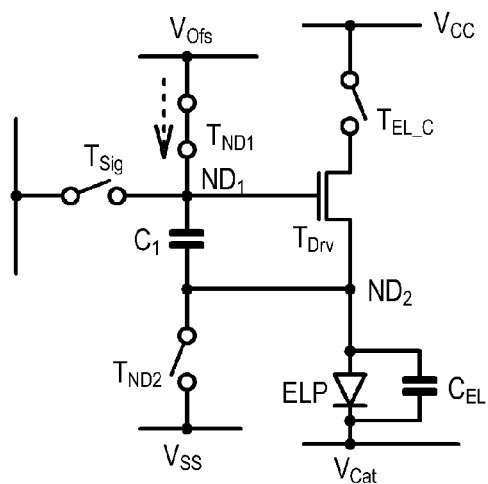

[Period-TP(5)$_1$] (See FIGS. 7B and 7C)

In [Period-TP(5)$_1$], a preprocess for performing a threshold voltage cancel process described below is performed. That is, at the time of the start of [Period-TP(5)$_1$], if the first node initialization transistor control line AZ$_{ND1}$ and the second node initialization transistor control line AZ$_{ND2}$ are at high level on the basis of the operation of the first node initialization transistor control circuit 104 and the second node initialization transistor control circuit 105, the first node initialization transistor $T_{ND1}$ and the second node initialization transistor $T_{ND2}$ are placed in the on state. As a result, the potential of the first node ND$_1$ becomes $V_{Ofs}$ (for example, 0 volt). The potential of the second node ND$_2$ becomes $V_{SS}$ (for example, −10 volt). Before [Period-TP(5)$_1$] is completed, if the second node initialization transistor control line AZ$_{ND2}$ is at low level on the basis of the operation of the second node initialization transistor control circuit 15, the second node initialization transistor $T_{ND2}$ is placed in the off state. The first node initialization transistor $T_{ND1}$ and the second node initialization transistor $T_{ND2}$ may be placed in the on state simultaneously, the first node initialization transistor $T_{ND1}$ may be placed in the on state ahead, or the second node initialization transistor $T_{ND2}$ may be placed in the on state ahead.

With the above-described process, the potential difference between the gate electrode and the source region of the drive transistor $T_{Drv}$ is equal to or greater than $V_{th}$, and the drive transistor $T_{Drv}$ becomes the on state.

Figure 7D:
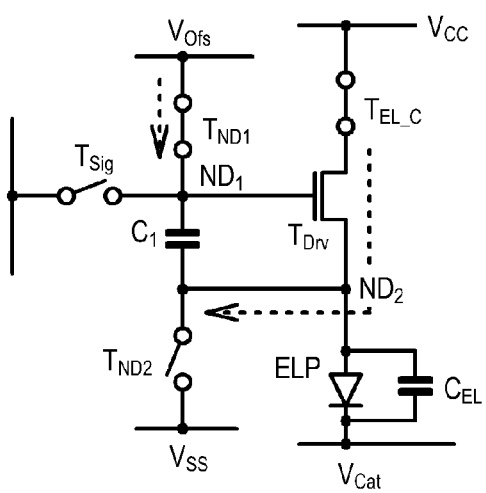

[Period-TP(5)$_2$] (See FIG. 7D)

Next, the threshold voltage cancel process is performed. That is, if the light-emission control transistor control line $CL_{EL\_C}$ is at high level on the basis of the operation of a light-emission control transistor control circuit 103 while the first node initialization transistor $T_{ND1}$ is maintained in the on state, the light-emission control transistor $T_{EL\_C}$ is placed in the on state. As a result, while the potential of the first node ND$_1$ is not changed (maintained at $V_{Ofs}$=0 volt), the potential of the second node ND$_2$ in the floating state rises, and the potential difference between the first node ND$_1$ and the second node ND$_2$ is brought close to the threshold voltage $V_{th}$ of the drive transistor $T_{Drv}$. If the potential difference between the gate electrode and the source region of the drive transistor $T_{Drv}$ reaches $V_{th}$, the drive transistor $T_{Drv}$ is placed in the off state. Specifically, the potential of the second node ND$_2$ in the floating state is brought close to ($V_{Ofs}-V_{th}$=−3 volt>$V_{SS}$), and finally becomes ($V_{Ofs}-V_{th}$). If Expression (2) is assured, in other words, if the potential is selected and determined so as to satisfy Expression (2), the light-emitting unit ELP does not emit light. Qualitatively, in the threshold voltage cancel process, how much the potential difference between the first node ND$_1$ and the second node ND$_2$ (in other words, the potential difference between the gate electrode and the source region of the drive transistor $T_{Drv}$) is brought close to the threshold voltage $V_{th}$ of the drive transistor $T_{Drv}$ depends on the time of the threshold voltage cancel process. Accordingly, for example, when a sufficient time for the threshold voltage cancel process is secured, the potential difference between the first node ND$_1$ and the second node ND$_2$ reaches the threshold voltage $V_{th}$ of the drive transistor $T_{Drv}$, and the drive transistor $T_{Drv}$ is placed in the off state. For example, when the time of the threshold voltage cancel process is set to be short, the potential difference between the first node $ND_1$ and the second node $ND_2$ is greater than the threshold voltage $V_{th}$ of the drive transistor $T_{Drv}$, and the drive transistor $T_{Drv}$ may not be placed in the off state. That is, as a result of the threshold voltage cancel process, it is not necessary that the drive transistor $T_{Drv}$ is placed in the off state.

$$(V_{Ofs} - V_{th}) < (V_{th\text{-}EL} + V_{Cat}) \quad (2)$$

In [Period-TP(5)$_2$], the potential of the second node $ND_2$ finally becomes, for example, $(V_{Ofs} - V_{th})$. That is, the potential of the second node $ND_2$ is determined depending on only the threshold voltage $V_{th}$ of the drive transistor $T_{Drv}$ and the voltage $V_{Ofs}$ for initializing the gate electrode of the drive transistor $T_{Drv}$. In other words, the potential of the second node $ND_2$ does not depend on the threshold voltage $V_{th\text{-}EL}$ of the light-emitting unit ELP.

Figure 8A:
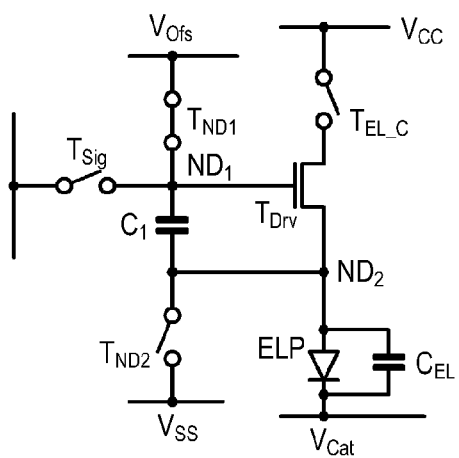
FIGS. 8A to 8E are diagrams, subsequent to FIG. 7D, schematically showing the on/off state and the like of each transistor which constitute a 5Tr/1C driving circuit of Example 3.

[Period-TP(5)$_3$] (See FIG. 8A)

Thereafter, if the light-emission control transistor control line $CL_{EL\_C}$ is at low level on the basis of the operation of the light-emission control transistor control circuit 103 while the first node initialization transistor $T_{ND1}$ is maintained in the on state, the light-emission control transistor $T_{EL\_C}$ is placed in the off state. As a result, the potential of the first node $ND_1$ is not changed (maintained at $V_{Ofs}$=0 volt), and the potential of the second node $ND_2$ in the floating state is not also changed and held at $(V_{Ofs} - V_{th} = -3$ volt).

Figure 8B:
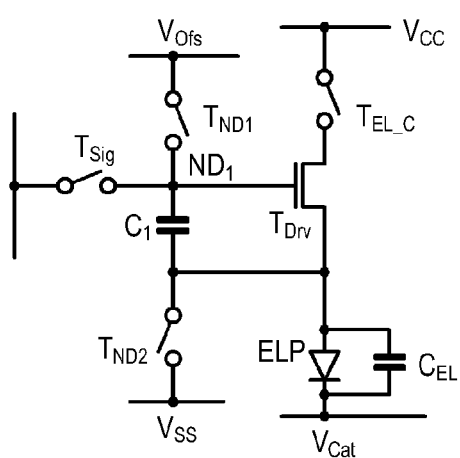

[Period-TP(5)$_4$] (See FIG. 8B)

Next, if the first node initialization transistor control line $AZ_{ND1}$ is at low level on the basis of the operation of the first node initialization transistor control circuit 104, the first node initialization transistor $T_{ND1}$ is placed in the off state. The potentials of the first node $ND_1$ and the second node $ND_2$ are not substantially changed (actually, a change in the potential occurs due to electrostatic coupling, such as parasitic capacitance, but this change is normally negligible).

Next, each period of [Period-TP(5)$_5$] to [Period-TP(5)$_7$] will be described. As described below, a write process is performed in [Period-TP(5)$_5$], and a mobility correction process is performed in [Period-TP(5)$_6$]. As described above, it is necessary that these processes are performed within the m-th horizontal scanning period. For convenience of description, description will be provided assuming that the beginning of [Period-TP(5)$_5$] and the end of [Period-TP (5)$_6$] respectively match the beginning and end of the m-th horizontal scanning period.

Figure 8C:
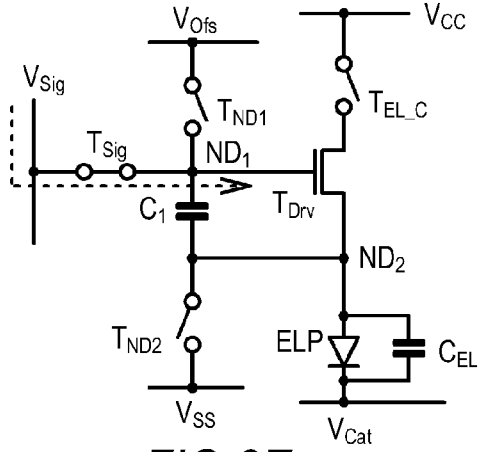

[Period-TP(5)$_5$] (See FIG. 8C)

Thereafter, the write process to the drive transistor $T_{Drv}$ is performed. Specifically, while the first node initialization transistor $T_{ND1}$, the second node initialization transistor $T_{ND2}$, and the light-emission control transistor $T_{EL\_C}$ are maintained in the off state, if the potential of the data line DTL is set as the driving signal (luminance signal) $V_{Sig}$ for controlling luminance of the light-emitting unit ELP on the basis of the operation of the video signal output circuit 102, and then the scanning line SCL is at high level on the basis of the operation of the scanning circuit 101, the video signal write transistor $T_{Sig}$ is placed in the on state. As a result, the potential of the first node $ND_1$ rises to $V_{Sig}$.

The capacitance of the capacitive unit $C_1$ has a value $c_1$, and the capacitance of parasitic capacitance $C_{EL}$ of the light-emitting unit ELP has a value $c_{EL}$. It is assumed that the value of parasitic capacitance between the gate electrode and the source region of the drive transistor $T_{Drv}$ is $c_{gs}$. When the potential of the gate electrode of the drive transistor $T_{Drv}$ is changed from $V_{Ofs}$ to $V_{Sig}$ ($>V_{Ofs}$), in principle, the potentials at both ends of the capacitive unit $C_1$ (the potentials of the first node $ND_1$ and the second node $ND_2$) are changed. That is, electric charges based on the change $(V_{Sig} - V_{Ofs})$ in the potential (=the potential of the first node $ND_1$) of the gate electrode of the drive transistor $T_{Drv}$ are divided into the capacitive unit $C_1$, the parasitic capacitance $C_{EL}$ of the light-emitting unit ELP, and parasitic capacitance between the gate electrode and the source region of the drive transistor $T_{Drv}$. Incidentally, if the value $c_{EL}$ is sufficiently greater than the value $c_1$ and the value $c_{gs}$, a change in the potential of the source region (second node $ND_2$) of the drive transistor $T_{Drv}$ based on the change $(V_{Sig} - V_{Ofs})$ in the potential of the gate electrode of the drive transistor $T_{Drv}$ is small. In general, the capacitance value $c_{EL}$ of the parasitic capacitance $C_{EL}$ of the light-emitting unit ELP is greater than the capacitance value $c_1$ of the capacitive unit $C_1$ and the value $c_{gs}$ of parasitic capacitance of the drive transistor $T_{Drv}$. For convenience of description, unless particularly required, description will be provided without taking into consideration a change in the potential of the second node $ND_2$ due to a change in the potential of the first node $ND_1$. The same applies to other driving circuits. The driving timing charge of FIG. 6 is shown without taking into consideration a change in the potential of the second node $ND_2$ due to a change in the potential of the first node $ND_1$. When the potential of the gate electrode of the drive transistor $T_{Drv}$ (first node $ND_1$) is $V_g$, and the potential of the source region of the drive transistor $T_{Drv}$ (second node $ND_2$) is $V_s$, the value of $V_g$ and the value of $V_s$ are as follows. For this reason, the potential difference between the first node $ND_1$ and the second node $ND_2$, that is, the potential difference $V_{gs}$ between the gate electrode and the source region of the drive transistor $T_{Drv}$ can be expressed by Expression (3).

$$V_g = V_{Sig}$$

$$V_s \approx V_{Ofs} - V_{th}$$

$$V_{gs} \approx V_{Sig} - (V_{Ofs} - V_{th}) \quad (3)$$

That is, $V_{gs}$ which is obtained in the write process to the drive transistor $T_{Drv}$ depends on only the driving signal (luminance signal) $V_{Sig}$ for controlling luminance of the light-emitting unit ELP, the threshold voltage $V_{th}$ of the drive transistor $T_{Drv}$, and the voltage $V_{Ofs}$ for initializing the gate electrode of the drive transistor $T_{Drv}$. $V_{gs}$ does not depend on the threshold voltage $V_{th\text{-}EL}$ of the light-emitting unit ELP.

Figure 8D:
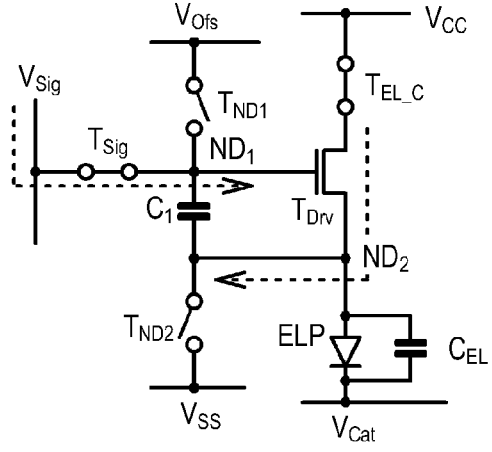

[Period-TP(5)$_6$] (See FIG. 8D)

Thereafter, the potential of the source region of the drive transistor $T_{Drv}$ (second node $ND_2$) is corrected on the basis of the magnitude of mobility $\mu$ of the drive transistor $T_{Drv}$ (mobility correction process).

In general, when the drive transistor $T_{Drv}$ is manufactured using a polysilicon thin film transistor or the like, variation in mobility $\mu$ is inevitably generated between transistors. Accordingly, even when the driving signal $V_{Sig}$ of the same value is applied to the gate electrodes of a plurality of drive transistors $T_{Drv}$ which are different in mobility $\mu$, there is a difference between the drain current $I_{ds}$ which flows in the drive transistor $T_{Drv}$ having large mobility $\mu$ and the drain current $I_{ds}$ which flows in the drive transistor $T_{Drv}$ having small mobility $\mu$. If this difference is generated, screen uniformity of the display device is damaged.

Accordingly, specifically, if the light-emission control transistor control line $CL_{EL\_C}$ is at high level on the basis of the operation of the light-emission control transistor control circuit 103 while the drive transistor $T_{Drv}$ is maintained in the on state, the light-emission control transistor $T_{EL\_C}$ is placed in the on state. Next, if the scanning line SCL is at low level on the basis of the operation of the scanning circuit 101 when a predetermined time ($t_0$) has elapsed, the video signal write transistor $T_{Sig}$ is placed in the off state, and the first node $ND_1$ (the gate electrode of the drive transistor $T_{Drv}$) is placed in the floating state. As a result, when the value of mobility μ of the drive transistor $T_{Drv}$ is large, the amount ΔV (potential correction value) of rise in the potential of the source region of the drive transistor $T_{Drv}$ increases. When the value of mobility μ of the drive transistor $T_{Drv}$ is small, the amount ΔV (potential correction value) of rise in the potential of the source region of the drive transistor $T_{Drv}$ decreases. The potential difference $V_{gs}$ between the gate electrode and the source region of the drive transistor $T_{Drv}$ is modified from Expression (3) to Expression (4).

$$V_{gs} \approx V_{Sig} - (V_{Ofs} - V_{th}) - \Delta V \quad (4)$$

A predetermined time (the full time $t_0$ of [Period-TP(5)$_6$]) for performing the mobility correction process may be determined in advance as a design value at the time of design of the display device. The full time $t_0$ of [Period-TP(5)$_6$] is determined such that the potential ($V_{Ofs} - V_{th} + \Delta V$) of the source region of the drive transistor $T_{Drv}$ at this time satisfies Expression (2'). Accordingly, in [Period-TP(5)$_6$], the light-emitting unit ELP does not emit light. With the mobility correction process, variation in the coefficient k($\equiv(1/2)\cdot$(W/L)$\cdot C_{ox}$) is corrected simultaneously.

$$(V_{Ofs} - V_{th} + \Delta V) < (V_{th\text{-}EL} + V_{Cat}) \quad (2')$$

Figure 8E:
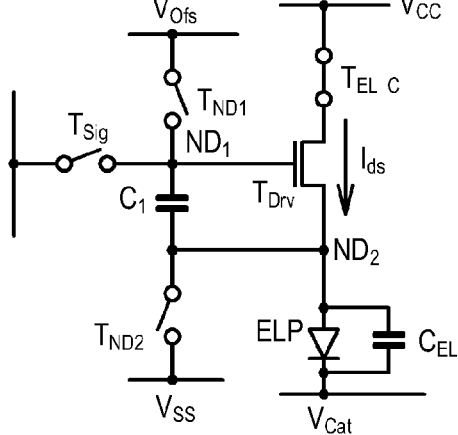

[Period-TP(5)$_2$] (See FIG. 8E)

With the above-described operation, the threshold voltage cancel process, the write process, and the mobility correction process are completed. On the other hand, if the scanning line SCL is at low level on the basis of the operation of the scanning circuit 101, as a result, the video signal write transistor $T_{Sig}$ is placed in the off state, and the first node $ND_2$, that is, the gate electrode of the drive transistor $T_{Drv}$ is placed in the floating state. The light-emission control transistor $T_{EL\_C}$ is maintained in the on state, and the drain region of the light-emission control transistor $T_{EL\_C}$ is connected to the current supply unit 100 (the voltage $V_{CC}$, for example, 20 volt) for controlling light emission of the light-emitting unit ELP. As a result, the potential of the second node $ND_2$ rises.

As described above, since the gate electrode of the drive transistor $T_{Drv}$ is in the floating state, and the capacitive unit $C_2$ is provided, the gate electrode of the drive transistor $T_{Drv}$ undergoes the same phenomenon as in a so-called bootstrap circuit, and the potential of the first node $ND_1$ also rises. As a result, the potential difference $V_{gs}$ between the gate electrode and the source region of the drive transistor $T_{Drv}$ is held at the value of Expression (4).

Since the potential of the second node $ND_2$ rises and exceeds ($V_{th\text{-}EL} + V_{Cat}$), the light-emitting unit ELP start to emit light. At this time, since a current which flows in the light-emitting unit ELP is the drain current $I_{ds}$ which flows from the drain region to the source region of the drive transistor $T_{Drv}$, this current can be expressed by Expression (1). From Expressions (1) and (4), Expression (1) may be modified to Expression (5).

$$I_{ds} = k \cdot \mu \cdot (V_{Sig} - V_{Ofs} - \Delta V)^2 \quad (5)$$

Accordingly, when $V_{Ofs}$ is set to 0 volt, the current $I_{ds}$ which flows in the light-emitting unit ELP is in proportion to the square of a value obtained by subtracting the potential correction value ΔV of the second node $ND_2$ (the source region of the drive transistor $T_{Drv}$) due to mobility μ of the drive transistor $T_{Drv}$ from the value of the driving signal (luminance signal) $V_{Sig}$ for controlling luminance of the light-emitting unit ELP. In other words, the current $I_{ds}$ which flows in the light-emitting unit ELP does not depend on the threshold voltage $V_{th\text{-}EL}$ of the light-emitting unit ELP and the threshold voltage $V_{th}$ of the drive transistor $T_{Drv}$. That is, the light-emission amount (luminance) of the light-emitting unit ELP is not affected by the threshold voltage $V_{th\text{-}EL}$ of the light-emitting unit ELP and the threshold voltage $V_{th}$ of the drive transistor $T_{Drv}$. Luminance of the (n,m)th light-emitting unit ELP has a value corresponding to the relevant current $I_{ds}$.

As the drive transistor $T_{Drv}$ has larger mobility μ, the potential correction value ΔV increases, such that the value of $V_{gs}$ on the left side of Expression (4) decreases. Accordingly, in Expression (5), even when the value of mobility μ is large, the value of ($V_{Sig} - V_{Ofs} - \Delta V)^2$ decreases, thereby correcting the drain current $I_{ds}$. That is, in the drive transistor $T_{Drv}$ having different mobility μ, if the value of the driving signal (luminance signal) $V_{Sig}$ is the same, and the drain current $I_{ds}$ is substantially the same. As a result, the current $I_{ds}$ which flows in the light-emitting unit ELP and controls luminance of the light-emitting unit ELP is uniformized. That is, variation in luminance of the light-emitting unit due to variation in mobility μ (also variation in k) can be corrected.

The light-emission state of the light-emitting unit ELP continues up to the (m+m'−1)th horizontal scanning period. This time corresponds to the end of [Period-TP(5)$_{-1}$].

With the above, the operation of light emission of the light-emitting unit ELP [the (n,m)th subpixel] is completed.

In [Period-TP(5)$_7$] (see FIG. 8E), if the potential of the second node $ND_2$ rises and exceeds ($V_{th\text{-}EL} + V_{Cat}$), light emission of the light-emitting unit ELP starts. Meanwhile, when a back gate effect occurs due to a rise in the potential of the second node $ND_2$, the current $I_{ds}$ which flows in the drive transistor $T_{Drv}$ decreases. Incidentally, in the driving circuit according to the embodiment of the present disclosure, since the other region of the source/drain regions of the drive transistor and the second well are electrically connected together, the potential of the second well rises with a rise in the potential of the second node $ND_2$, and there is no change in the potential $V_{bs}$ between the second well and the source region of the drive transistor $T_{Drv}$. Accordingly, there is not the problem of a decrease in the current $I_{ds}$ flowing in the drive transistor $T_{Drv}$ due to the back gate effect. The same applies to Examples 4 to 6 described below.

Example 4

Figure 10:
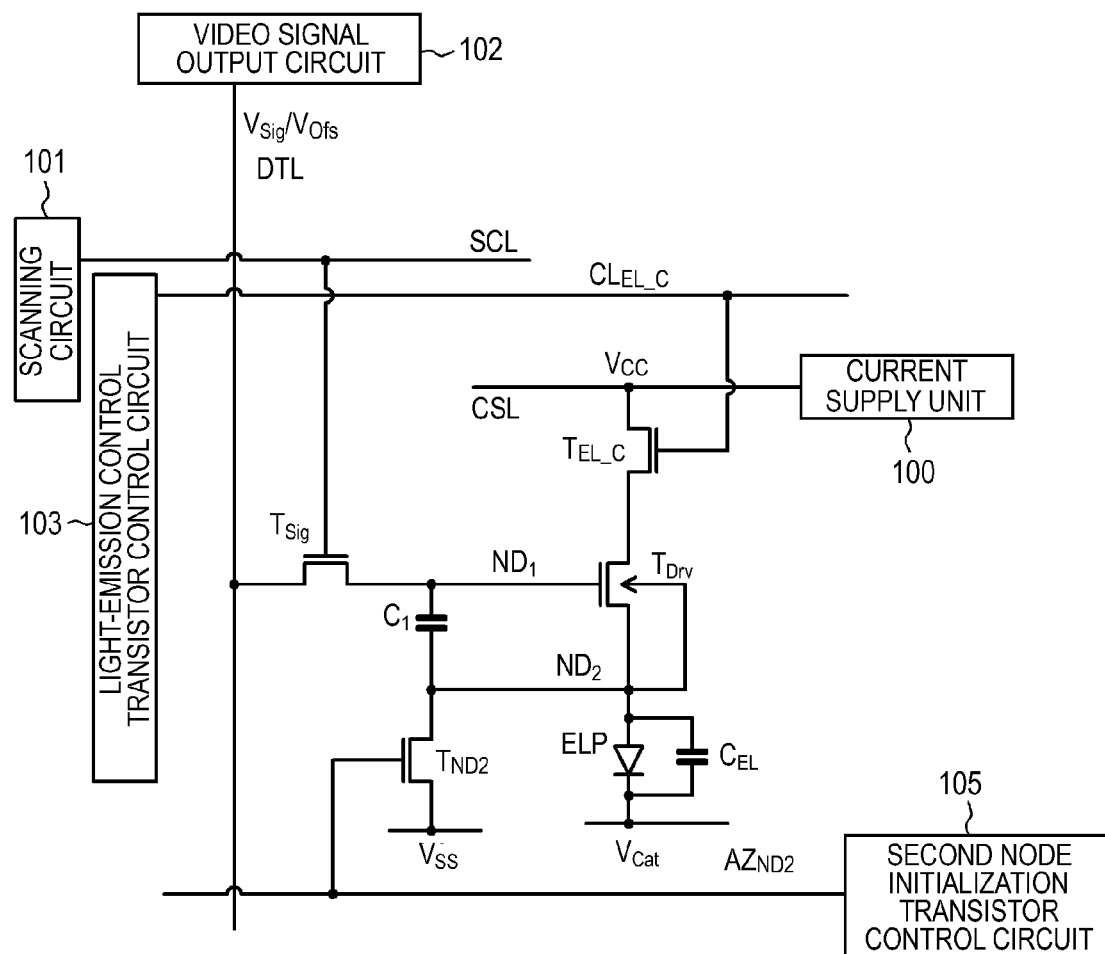
FIG. 10 is an equivalent circuit diagram of a 4Tr/1C driving circuit of Example 4.
Figure 11:
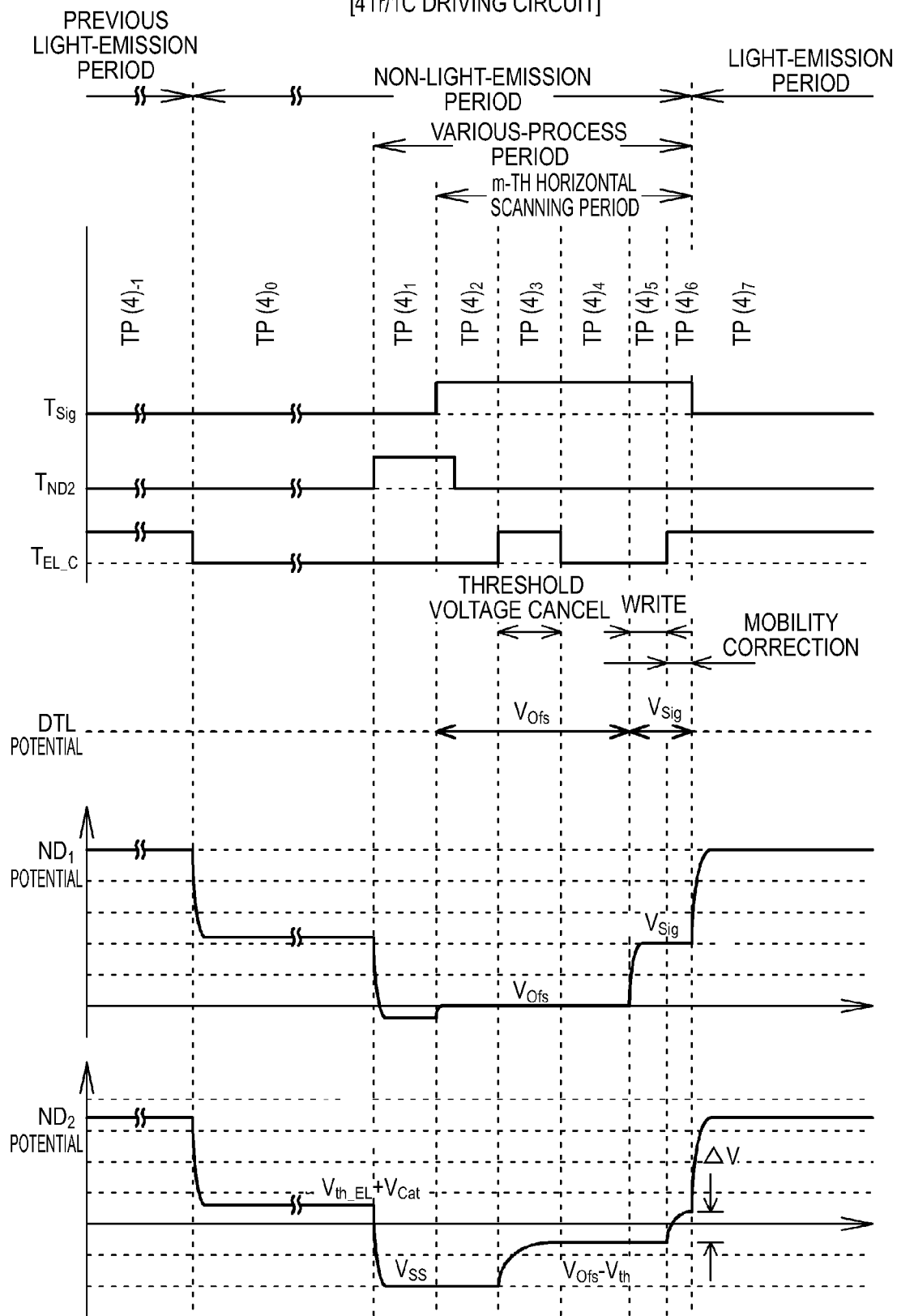
FIG. 11 is a schematic driving timing chart of a 4Tr/1C driving circuit of Example 4.

Example 4 relates to a 4Tr/1C driving circuit. FIG. 9 is a conceptual diagram of a driving circuit of Example 4. FIG. 10 is an equivalent circuit diagram of a 4Tr/1C driving circuit. FIG. 11 is a schematic driving timing chart. FIGS. 12A to 12D and 13A to 13D schematically show the on/off state and the like of each transistor.

In the 4Tr/1C driving circuit, the first node initialization transistor $T_{ND1}$ is removed from the above-described 5Tr/1C driving circuit. That is, the 4Tr/1C driving circuit has four transistors of a video signal write transistor $T_{Sig}$, a drive transistor $T_{Drv}$, a light-emission control transistor $T_{EL\_C}$, and a second node initialization transistor $T_{ND2}$, and one capacitive unit $C_1$.

[Light-Emission Control Transistor $T_{EL\_C}$]

The configuration of the light-emission control transistor $T_{EL\_C}$ is the same as the light-emission control transistor $T_{EL\_C}$ described in the 5Tr/1C driving circuit, and thus detailed description thereof will not be repeated.

[Drive Transistor $T_{Drv}$]

The configuration of the drive transistor $T_{Drv}$ is the same as the drive transistor $T_{Drv}$ described in the 5Tr/1C driving circuit, and thus detailed description thereof will not be repeated.

[Second Node Initialization Transistor $T_{ND2}$]

The configuration of the second node initialization transistor $T_{ND2}$ is the same as the second node initialization transistor $T_{ND2}$ described in the 5Tr/1C driving circuit, and thus detailed description thereof will not be repeated.

[Video Signal Write Transistor $T_{Sig}$]

The configuration of the video signal write transistor $T_{Sig}$ is the same as the video signal write transistor $T_{Sig}$ described in the 5Tr/1C driving circuit, and thus detailed description thereof will not be repeated. While one region of the source/drain regions of the video signal write transistor $T_{Sig}$ is connected to the data line DTL, not only the driving signal (luminance signal) $V_{Sig}$ for controlling luminance of the light-emitting unit ELP but also the voltage $V_{Ofs}$ for initializing the gate electrode of the drive transistor $T_{Drv}$ are supplied from the video signal output circuit 102. This point is different from the operation of the video signal write transistor $T_{Sig}$ described in the 5Tr/1C driving circuit. Signals/voltages (for example, a signal for precharge driving) other than $V_{Sig}$ or $V_{Ofs}$ may be supplied from the video signal output circuit 102 to one region of the source/drain regions through the data line DTL.

[Light-Emitting Unit ELP]

The configuration of the light-emitting unit ELP is the same as the light-emitting unit ELP described in the 5Tr/1C driving circuit, and thus detailed description thereof will not be repeated.

Hereinafter, the operation of the 4Tr/1C driving circuit will be described.

Figure 12A:
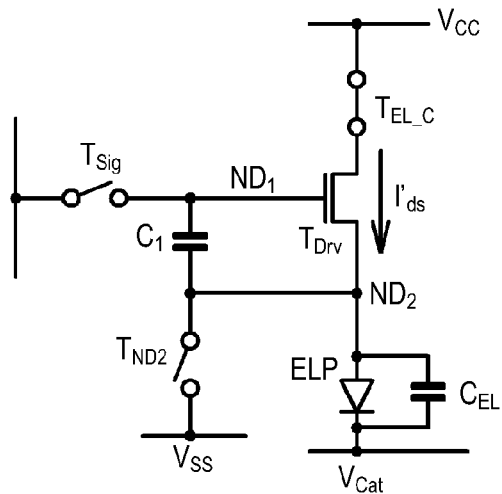
FIGS. 12A to 12D are diagrams schematically showing the on/off state and the like of each transistor which constitutes a 4Tr/1C driving circuit of Example 4.

[Period-TP(4)$_{-1}$] (FIGS. 11 and 12A)

[Period-TP(4)$_{-1}$] is, for example, the operation in the previous display frame and is the same operation as [Period-TP(5)$_{-1}$] in the 5Tr/1C driving circuit.

[Period-TP(4)$_0$] to [Period-TP(4)$_4$] shown in FIG. 11 are the periods corresponding to [Period-TP(5)$_0$] to [Period-TP(5)$_4$] shown in FIG. 6, and are the operation periods immediately before the next write process is performed. Similarly to the 5Tr/1C driving circuit, in [Period-TP(4)$_0$] to [Period-TP(4)$_4$], the (n,m)th light-emitting unit ELP is in the non-light-emission state. The operation of the 4Tr/1C driving circuit is different from the operation of the 5Tr/1C driving circuit in that, in addition to [Period-TP(4)$_5$] to [Period-TP(4)$_6$] shown in FIG. 6, [Period-TP(4)$_2$] to [Period-TP(4)$_4$] are also included in the m-th horizontal scanning period. For convenience of description, description will be provided assuming that the beginning of [Period-TP(4)$_2$] and the end of [Period-TP(4)$_6$] respectively match the beginning and end of the m-th horizontal scanning period.

Hereinafter, each period of [Period-TP(4)$_0$] to [Period-TP(4)$_4$] will be described. As described in the 5Tr/1C driving circuit, the length of the beginning of [Period-TP(4)$_1$] or each period of [Period-TP(4)$_1$] to [Period-TP(4)$_4$] may be appropriately set in accordance with design for the display device.

[Period-TP(4)$_0$]

[Period-TP(4)$_0$] is, for example, the operation from the previous display frame to the current display frame, and is substantially the same operation as [Period-TP(5)$_0$] described in the 5Tr/1C driving circuit.

Figure 12B:
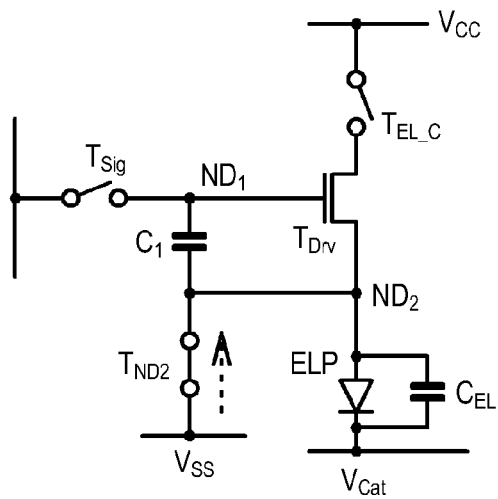

[Period-TP(4)$_1$] (see FIG. 12B)

[Period-TP(4)$_1$] corresponds to [Period-TP(5)$_1$] described in the 5Tr/1C driving circuit. In [Period-TP(4)$_1$], a preprocess for performing a threshold voltage cancel process described below is performed. At the time of the start of [Period-TP(4)$_1$], if the second node initialization transistor control line $AZ_{ND2}$ is at high level on the basis of the operation of the second node initialization transistor control circuit 105, the second node initialization transistor $T_{ND2}$ is placed in the on state. As a result, the potential of the second node $ND_2$ becomes $V_{SS}$ (for example, −10 volt). In order to follow the potential drop of the second node $ND_2$, the potential of the first node $ND_1$ (the gate electrode of the drive transistor $T_{Drv}$) in the floating state also drops. Since the potential of the first node $ND_1$ in [Period-TP(4)$_1$] depends on the potential (defined in accordance with the value of $V_{Sig}$ in the previous frame) of the first node $ND_1$ in the [Period-TP(4)$_{-1}$], the potential of the first node $ND_1$ does not have a constant value.

Figure 12C:
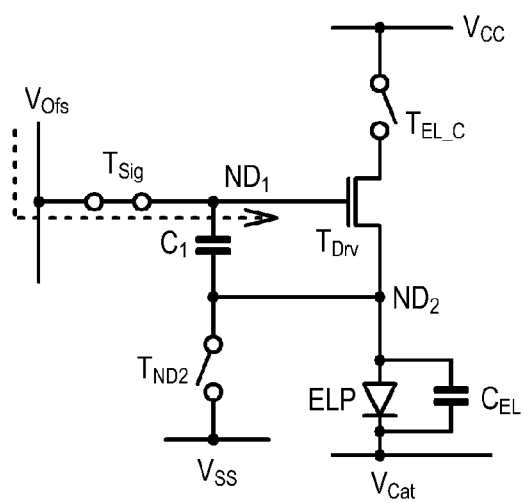

[Period-TP(4)$_2$] (See FIG. 12C)

Thereafter, if the potential of the data line DTL is set to $V_{Ofs}$ on the basis of the operation of the video signal output circuit 102, and the scanning line SCL is at high level on the basis of the operation of the scanning circuit 101, the video signal write transistor $T_{Sig}$ is placed in the on state. As a result, the potential of the first node $ND_1$ becomes $V_{Ofs}$ (for example, 0 volt). The potential of the second node $ND_2$ is held at $V_{SS}$ (for example, −10 volt). Thereafter, if the second node initialization transistor control line $AZ_{ND2}$ is at low level on the basis of the operation of the second node initialization transistor control circuit 105, the second node initialization transistor $T_{ND2}$ is placed in the off state.

Simultaneously with the start of [Period-TP(4)$_1$] or halfway of [Period-TP(4)$_1$], the video signal write transistor $T_{Sig}$ may be placed in the on state.

With the above-described process, the potential difference between the gate electrode and the source region of the drive transistor $T_{Drv}$ is equal to or greater than $V_{th}$, and the drive transistor $T_{Drv}$ is placed in the on state.

Figure 12D:
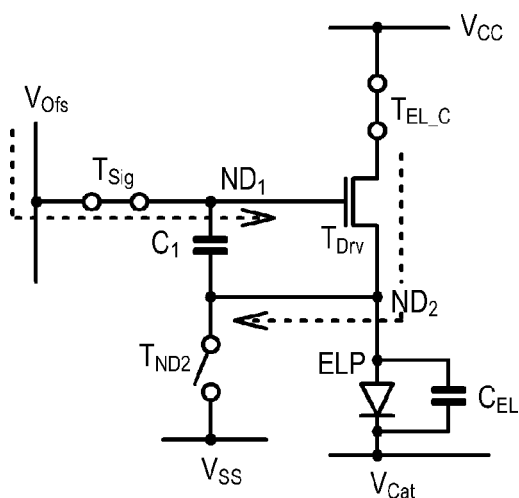

[Period-TP(4)$_3$] (See FIG. 12D)

Next, the threshold voltage cancel process is performed. That is, if the light-emission control transistor control line $CL_{EL\_C}$ is at high level on the basis of the operation of the light-emission control transistor control circuit 103 while the video signal write transistor $T_{Sig}$ is maintained in the on state, the light-emission control transistor $T_{EL\_C}$ is placed in the on state. As a result, while the potential of the first node $ND_1$ is not changed (maintained at $V_{Ofs}$=0 volt), the potential of the second node $ND_2$ in the floating state rises, and the potential difference between the first node $ND_1$ and the second node $ND_2$ is brought close to the threshold voltage $V_{th}$ of the drive transistor $T_{Drv}$. If the potential difference between the gate electrode and the source region of the drive transistor $T_{Drv}$ reaches $V_{th}$, the drive transistor $T_{Drv}$ is placed in the off state. Specifically, the potential of the second node $ND_2$ in the floating state is brought close to ($V_{Ofs}-V_{th}$=−3 volt) and finally becomes ($V_{Ofs}-V_{th}$). If Expression (2) is assured, in other words, if the potential is selected and determined so as to satisfy Expression (2), the light-emitting unit ELP does not emit light.

In [Period-TP(4)$_3$], the potential of the second node $ND_2$ finally becomes, for example, ($V_{Ofs}-V_{th}$). That is, the potential of the second node $ND_2$ is determined depending on only the threshold voltage $V_{th}$ of the drive transistor $T_{Drv}$ and the voltage $V_{Ofs}$ for initializing the gate electrode of the drive transistor $T_{Drv}$. The potential of the second node $ND_2$ does not depend on the threshold voltage $V_{th-EL}$ of the light-emitting unit ELP.

Figure 13A:
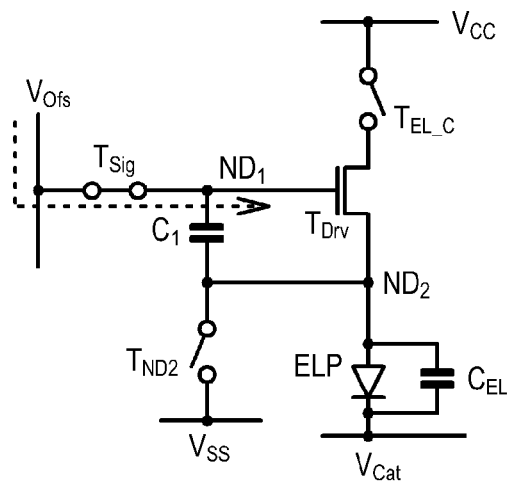
FIGS. 13A to 13D are diagrams, subsequent to FIG. 12D, schematically showing the on/off state and the like of each transistor which constitutes a 4Tr/1C driving circuit of Example 4.

[Period-TP(4)$_4$] (See FIG. 13A)

Thereafter, if the light-emission control transistor control line $CL_{EL\_C}$ is at low level on the basis of the operation of the light-emission control transistor control circuit 103 while the video signal write transistor $T_{Sig}$ is maintained in the on state, the light-emission control transistor $T_{EL\_C}$ is placed in the off state. As a result, the potential of the first node $ND_1$ is not changed (maintained at $V_{Ofs}$=0 volt), and the potential of the second node $ND_2$ in the floating state is not substantially changed (actually, a change in the potential occurs due to electrostatic coupling, such as parasitic capacitance, but this change is normally negligible) and held at ($V_{Ofs}$−$V_{th}$=−3 volt).

Next, each period of [Period-TP(4)$_5$] to [Period-TP(4)$_7$] will be described. These periods are substantially the same operations as [Period-TP(5)$_5$] to [Period-TP(5)$_7$] described in the 5Tr/1C driving circuit.

Figure 13B:
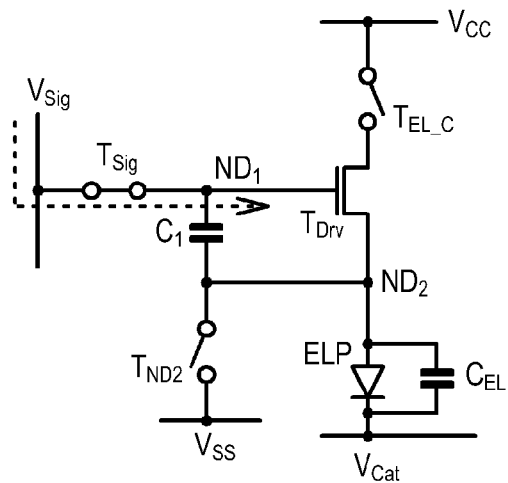

[Period-TP(4)$_5$] (See FIG. 13B)

Next, the write process to the drive transistor $T_{Drv}$ is performed. Specifically, while the video signal write transistor $T_{Sig}$ is maintained in the on state, and the second node initialization transistor $T_{ND2}$ and the light-emission control transistor $T_{EL\_C}$ are maintained in the off state, the potential of the data line DTL is switched from $V_{Ofs}$ to the driving signal (luminance signal) $V_{Sig}$ for suppressing luminance of the light-emitting unit ELP on the basis of the operation of the video signal output circuit 102. As a result, the potential of the first node $ND_1$ rises to $V_{Sig}$. The video signal write transistor $T_{Sig}$ is placed in the off state once, and while the video signal write transistor $T_{Sig}$, the second node initialization transistor $T_{ND2}$, and the light-emission control transistor $T_{EL\_C}$ are maintained in the off state, the potential of the data line DTL is changed to the driving signal (luminance signal) $V_{Sig}$ for controlling luminance of the light-emitting unit ELP on the basis of the operation of the video signal output circuit 102. Thereafter, if the scanning line SCL is at high level (that is, by the slowed scanning signal) while the second node initialization transistor $T_{ND2}$ and the light-emission control transistor $T_{EL\_C}$ are maintained in the off state, the video signal write transistor $T_{Sig}$ is placed in the on state.

Accordingly, as described in the 5Tr/1C driving circuit, the value described in Expression (3) can be obtained as the potential difference between the first node $ND_1$ and the second node $ND_2$, that is, the potential difference $V_{gs}$ between the gate electrode and the source region of the drive transistor $T_{Drv}$.

That is, in the 4Tr/1C driving circuit, $V_{gs}$ which is obtained in the write process to the drive transistor $T_{Drv}$ depends on only the driving signal (luminance signal) $V_{Sig}$ for controlling luminance of the light-emitting unit ELP, the threshold voltage $V_{th}$ of the drive transistor $T_{Drv}$, and the voltage $V_{Ofs}$ for initializing the gate electrode of the drive transistor $T_{Drv}$. $V_{gs}$ does not depend on the threshold voltage $V_{th-EL}$ of the light-emitting unit ELP.

Figure 13C:
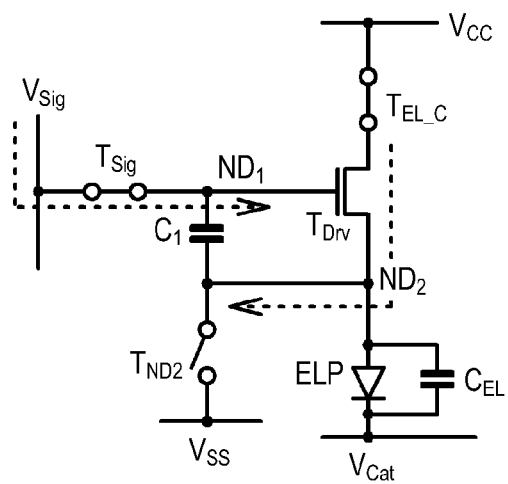

[Period-TP(4)$_6$] (See FIG. 13C)

Thereafter, the potential of the source region of the drive transistor $T_{Drv}$ (the second node $ND_2$) is corrected on the basis of the magnitude of mobility μ of the drive transistor $T_{Drv}$ is corrected (mobility correction process). Specifically, the same operation as [Period-TP(5)$_6$] described in the 5Tr/1C driving circuit may be performed. A predetermined time (the full time $t_0$ of [Period-TP(4)$_6$]) for performing the mobility correction process may be determined in advance as a design value at the time of design of the display device.

Figure 13D:
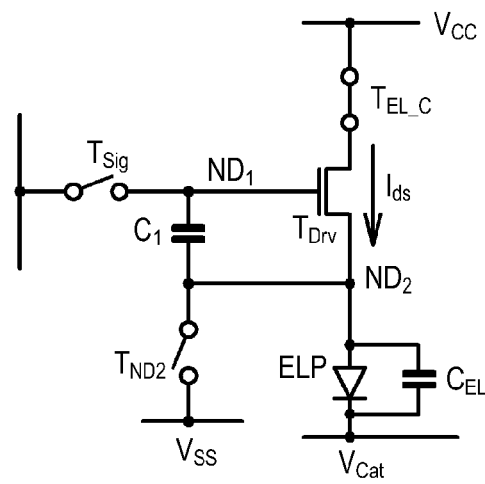

[Period-TP(4)$_7$] (See FIG. 13D)

With the above-described operation, the threshold voltage cancel process, the write process, and the mobility correction process are completed. Since the same process as [Period-TP(5)$_7$] described in the 5Tr/1C driving circuit is performed, and the potential of the second node $ND_2$ rises and exceeds ($V_{th-EL}$+$V_{Cat}$), the light-emitting unit ELP starts to emit light. At this time, since a current which flows in the light-emitting unit ELP can be obtained by Expression (5), the $I_{ds}$ which flows in the light-emitting unit ELP does not depend on the threshold voltage $V_{th-EL}$ of the light-emitting unit ELP and the threshold voltage $V_{th}$ of the drive transistor $T_{Drv}$. That is, the light-emission amount (luminance) of the light-emitting unit ELP is not affected by the threshold voltage $V_{th-EL}$ of the light-emitting unit ELP and the threshold voltage $V_{th}$ of the drive transistor $T_{Drv}$. It is also possible to suppress the occurrence of variation in the drain current $I_{ds}$ due to variation in mobility of the drive transistor $T_{Drv}$.

The light-emission state of the light-emitting unit ELP continues up to the (m+m'−1)th horizontal scanning period. This time corresponds to the end of [Period-TP(4)$_{-1}$].

With the above, the operation of light emission of the light-emitting unit ELP [the (n,m)th subpixel] is completed.

Example 5

Figure 14:
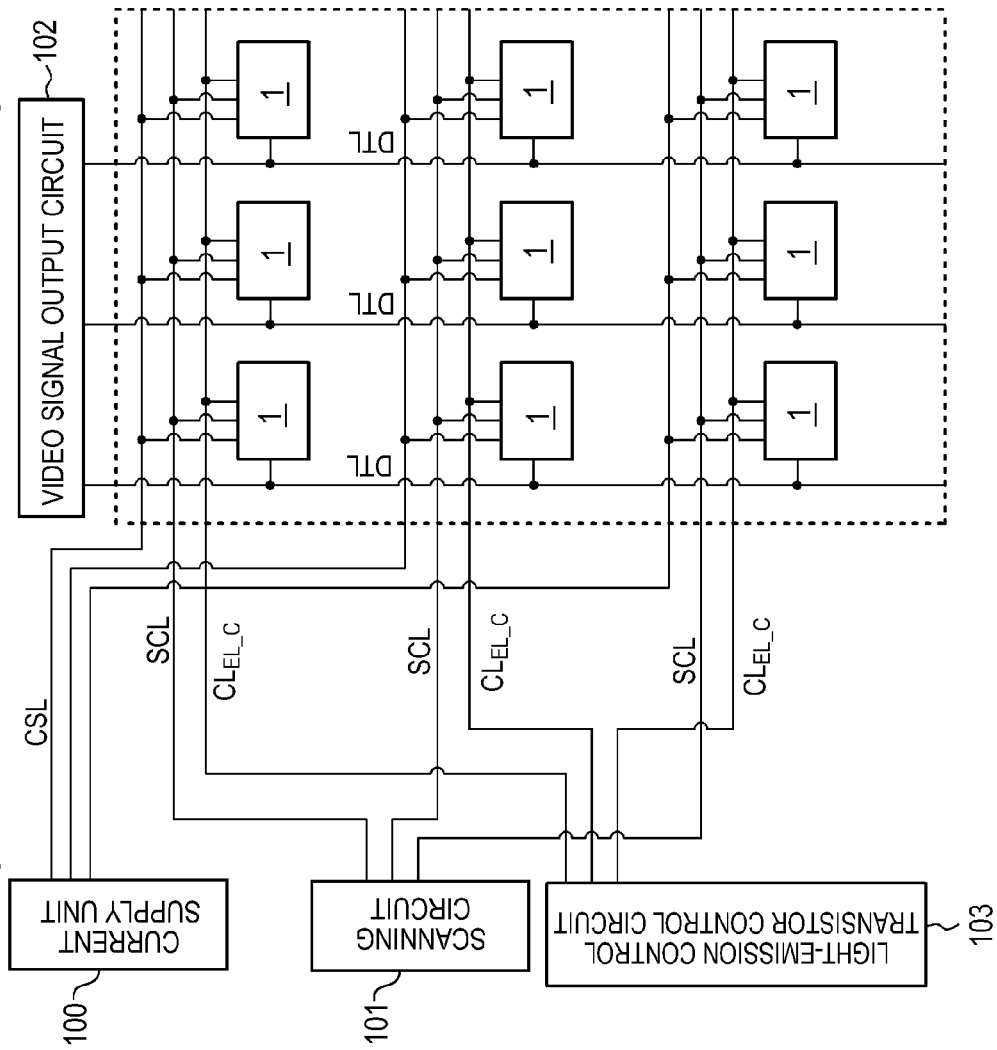
FIG. 14 is a conceptual diagram of a circuit which constitutes a display device of Example 5 or a display device of an electronic apparatus.
Figure 15:
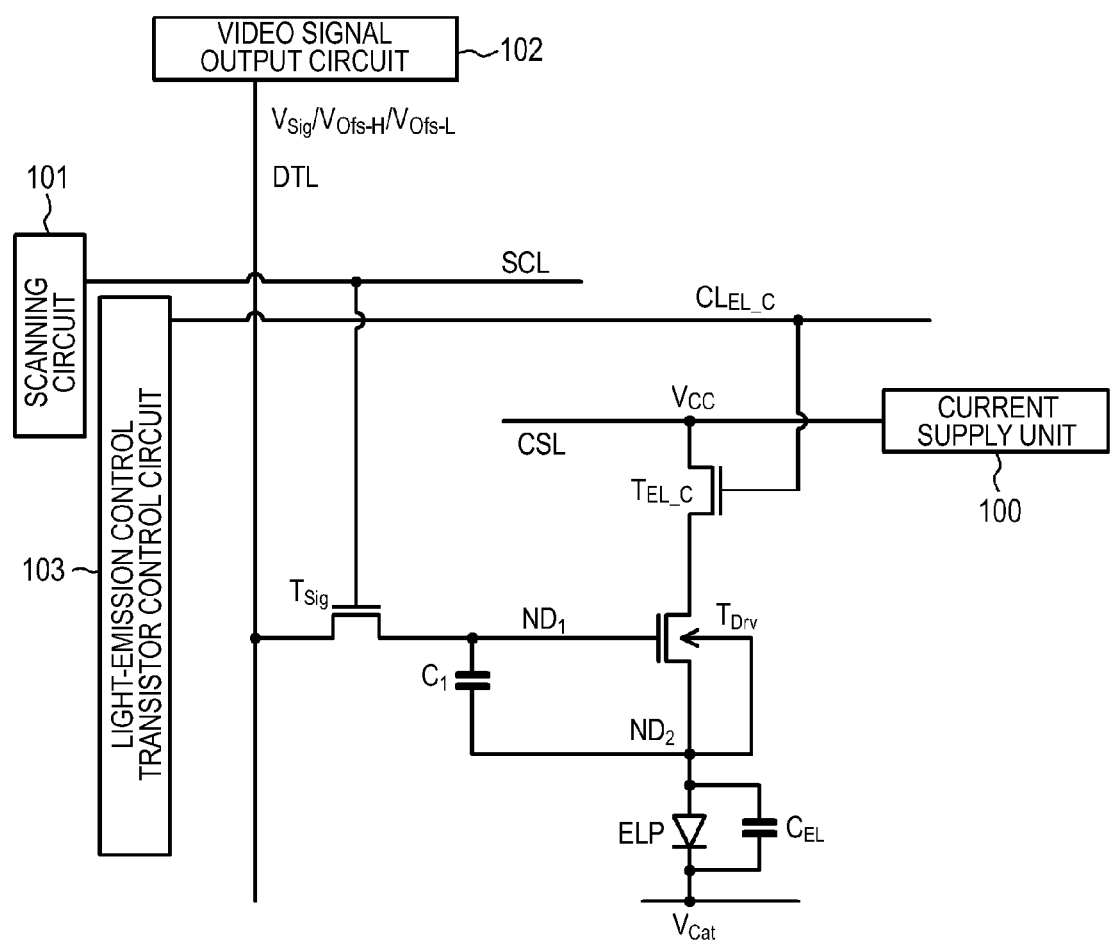
FIG. 15 is an equivalent circuit diagram of a 3Tr/1C driving circuit of Example 5.

Example 5 relates to a 3Tr/1C driving circuit. FIG. 14 is a conceptual diagram of a driving circuit of Example 5. FIG. 15 is an equivalent circuit diagram of a 3Tr/1C driving circuit. FIG. 16 is a schematic driving timing chart. FIGS. 17A to 17D and 18A to 18E schematically show the on/off state and the like of each transistor.

In the 3Tr/1C driving circuit, two transistors of the first node initialization transistor $T_{ND1}$ and the second node initialization transistor $T_{ND2}$ are removed from the above-described 5Tr/1C driving circuit. That is, the 3Tr/1C driving circuit has three transistors of a video signal write transistor $T_{Sig}$, a light-emission control transistor $T_{EL\_C}$, and a drive transistor $T_{Drv}$, and one capacitive unit $C_1$.

[Light-Emission Control Transistor $T_{EL\_C}$]

The configuration of the light-emission control transistor $T_{EL\_C}$ is the same as the light-emission control transistor $T_{EL\_C}$ described in the 5Tr/1C driving circuit, and thus detailed description thereof will not be repeated.

[Drive Transistor $T_{Drv}$]

The configuration of the drive transistor $T_{Drv}$ is the same as the drive transistor $T_{Drv}$ described in the 5Tr/1C driving circuit, and thus detailed description thereof will not be repeated.

[Video Signal Write Transistor $T_{Sig}$]

The configuration of the video signal write transistor $T_{Sig}$ is the same as the video signal write transistor $T_{Sig}$ described in the 5Tr/1C driving circuit, and thus detailed description thereof will not be repeated. While one region of the source/drain regions of the video signal write transistor $T_{Sig}$ is connected to the data line DTL, not only the driving signal (luminance signal) $V_{Sig}$ for controlling luminance of the light-emitting unit ELP but also a voltage $V_{Ofs-H}$ for initializing the gate electrode of the drive transistor $T_{Drv}$ and a voltage $V_{Ofs-L}$ are supplied from the video signal output circuit 102. This point is different from the operation of the video signal write transistor $T_{Sig}$ described in the 5Tr/1C driving circuit. Signals/voltages (for example, a signal for precharge driving) other than $V_{Sig}$ or $V_{Ofs-H}$/$V_{Ofs-L}$ may be supplied from the video signal output circuit 102 to one region of the source/drain regions through the data line DTL. The values of the voltage $V_{Ofs-H}$ and the voltage $V_{Ofs-L}$ are, not limited to, as follows, for example.

$V_{Ofs-H}$=about 30 volt
$V_{Ofs-L}$=about 0 volt

[Relationship Between Values $C_{EL}$ and $C_1$]

As described below, in the 3Tr/1C driving circuit, it is necessary to change the potential of the second node $ND_2$ using the data line DTL. In the 5Tr/1C driving circuit or the 4Tr/1C driving circuit described above, description has been provided assuming that the value $C_{EL}$ is sufficiently greater than the value $c_1$ and the value $c_{gs}$, and taking into consideration a change in the potential of the source region of the drive transistor $T_{Drv}$ (the second node $ND_2$) based on the change ($V_{Sig}$–$V_{Ofs}$) in the potential of the gate electrode of the drive transistor $T_{Drv}$ (the same applies to a 2Tr/1C driving circuit described below). In the 3Tr/1C driving circuit, for design, the value $c_1$ is set to be greater than other driving circuits (for example, the value $c_1$ is about ¼ to ⅓ of the value $c_{EL}$). Accordingly, a change in the potential of the second node $ND_2$ due to a change in the potential of the first node $ND_1$ is large compared to other driving circuits. For this reason, in case of 3Tr/1C, description will be provided taking into consideration a change in the potential of the second node $ND_2$ due to a change in the potential of the first node $ND_1$. A driving timing chart of FIG. 16 is shown taking into consideration a change in the potential of the second node $ND_2$ due to a change in the potential of the first node $ND_1$.

[Light-Emitting Unit ELP]

The configuration of the light-emitting unit ELP is the same as the light-emitting unit ELP described in the 5Tr/1C driving circuit, and thus detailed description thereof will not be repeated.

Hereinafter, the operation of the 3Tr/1C driving circuit will be described.

Figure 17A:
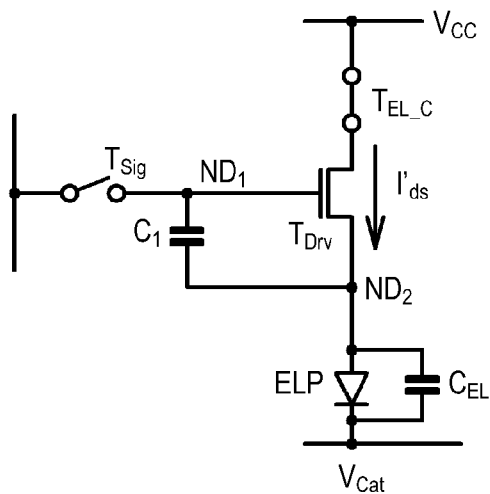
FIGS. 17A to 17D are diagrams schematically showing the on/off state and the like of each transistor which constitutes a 3Tr/1C driving circuit of Example 5.

[Period-TP(3)$_{-1}$] (See FIGS. 16 and 17A)

[Period-TP(3)$_{-1}$] is, for example, the operation in the previous display frame, and is substantially the same operation as [Period-TP(5)$_{-1}$] described in the 5Tr/1C driving circuit.

[Period-TP(3)$_0$] to [Period-TP(3)$_4$] shown in FIG. 16 are the period corresponding to [Period-TP(5)$_0$] to [Period-TP(5)$_4$] shown in FIG. 6, and are the operation periods immediately before the next write process is performed. Similarly to the 5Tr/1C driving circuit, in [Period-TP(3)$_0$] to [Period-TP(3)$_4$], the (n,m)th light-emitting unit ELP is in the non-light-emission state. As shown in FIG. 16, the operation of the 3Tr/1C driving circuit is different from the operation of the 5Tr/1C driving circuit in that, in addition to [Period-TP(3)$_5$] to [Period-TP(3)$_6$], [Period-TP(3)$_1$] to [Period-TP(3)$_4$] are also included in the m-th horizontal scanning period. For convenience of description, description will be provided assuming that the beginning of [Period-TP(3)$_1$] and the end of [Period-TP(3)$_6$] respectively match the beginning and end of the m-th horizontal scanning period.

Hereinafter, each period of [Period-TP(3)$_0$] to [Period-TP(3)$_4$] will be described. As described in the 5Tr/1C driving circuit, the length of each period of [Period-TP(3)$_1$] to [Period-TP(3)$_4$] may be appropriately set in accordance with design for the display device.

Figure 17B:
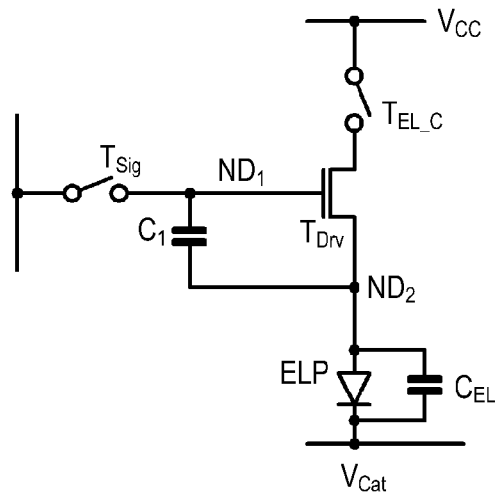

[Period-TP(3)$_0$] (See FIG. 17B)

[Period-TP(3)$_0$] is, for example, the operation from the previous display frame to the current display frame, and is substantially the same operation as [Period-TP(5)$_0$] described in the 5Tr/1C driving circuit.

Figure 17C:
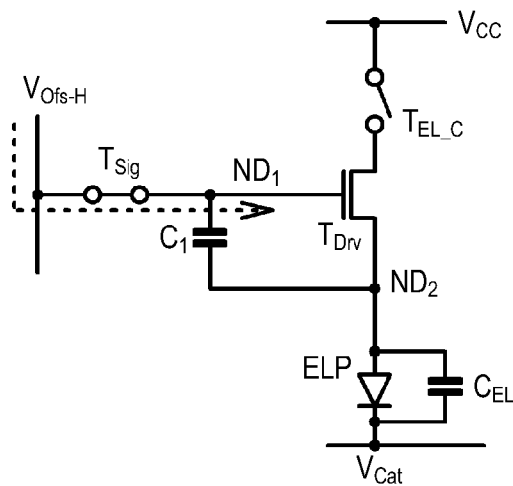

[Period-TP(3)$_1$] (See FIG. 17C)

The horizontal scanning period of the m-th row in the current display frame starts. At the time of the start of [Period-TP(3)$_2$], if the potential of the data line DTL is set to the voltage $V_{Ofs-H}$ for initializing the gate electrode of the drive transistor $T_{Drv}$ on the basis of the operation of the video signal output circuit 102, and then if the scanning line SCL is at high level on the basis of the operation of the scanning circuit 101, the video signal write transistor $T_{Sig}$ is placed in the on state. As a result, the potential of the first node $ND_2$ becomes $V_{Ofs-H}$. As described above, for design, since the value $c_1$ of the capacitive unit $C_2$ is greater than other driving circuits, the potential of the source region (the potential of the second node $ND_2$) rises. Since the potential difference between both ends of the light-emitting unit ELP exceeds the threshold voltage $V_{th-EL}$, the light-emitting unit ELP is placed in a conduction state, but the potential of the source region of the drive transistor $T_{Drv}$ drops directly to $(V_{th-EL}+V_{Cat})$ again. During this, although the light-emitting unit ELP can emit light, light emission is instantaneous, and there is no problem for practical use. The gate electrode of the drive transistor $T_{Drv}$ is held at the voltage $V_{Ofs-H}$.

Figure 17D:
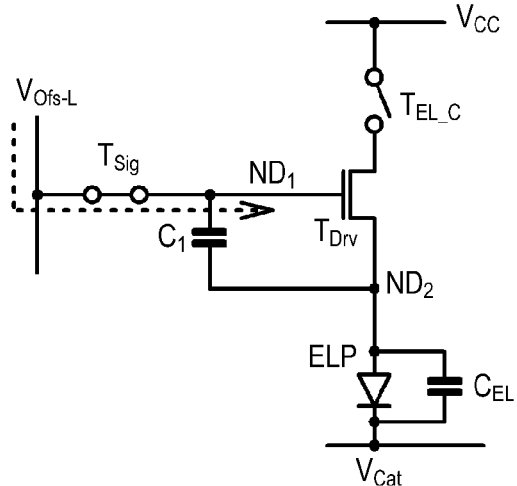

[Period-TP(3)$_2$] (See FIG. 17D)

Thereafter, if the potential of the data line DTL is changed from the voltage $V_{Ofs-H}$ for initializing the gate electrode of the drive transistor $T_{Drv}$ to the voltage $V_{Ofs-L}$ on the basis of the operation of the video signal output circuit 102, the potential of the first node $ND_1$ becomes $V_{Ofs-L}$. With the potential drop of the first node $ND_1$, the potential of the second node $ND_2$ also drops. That is, electric charges based on the change ($V_{Ofs-L}$–$V_{Ofs-H}$) in the potential of the gate electrode of the drive transistor $T_{Drv}$ are divided into the capacitive unit $C_1$, the parasitic capacitance $C_{EL}$ of the light-emitting unit ELP, and parasitic capacitance between the gate electrode and the source region of the drive transistor $T_{Drv}$. As the assumption of the operation in [Period-TP(3)$_3$] described below, at the time of the end of [Period-TP(3)$_2$], it is necessary that the potential of the second node $ND_2$ is lower than $V_{Ofs-L}$–$V_{th}$. The values of $V_{Ofs-H}$ and like are set so as to satisfy the conditions. That is, with the above-described process, the potential difference between the gate electrode and the source region of the drive transistor $T_{Drv}$ is equal to or greater than $V_{th}$, and the drive transistor $T_{Drv}$ is placed in the on state.

Figure 18A:
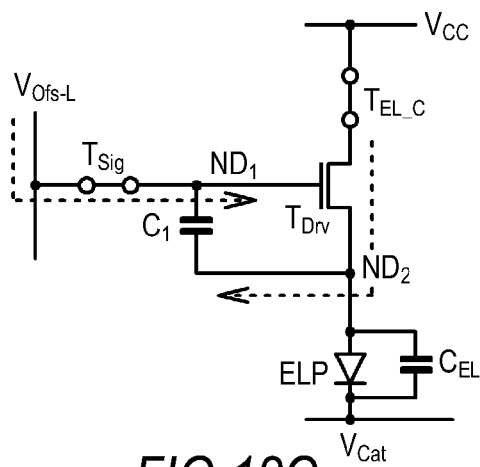
FIGS. 18A to 18E are diagrams, subsequent to FIG. 17D, schematically showing the on/off state and the like of each transistor which constitutes a 3Tr/1C driving circuit of Example 5.

[Period-TP(3)$_3$] (See FIG. 18A)

Next, the threshold voltage cancel process is performed. That is, if the light-emission control transistor control line $CL_{EL\_C}$ is at high level on the basis of the operation of the light-emission control transistor control circuit 103 while the video signal write transistor $T_{Sig}$ is maintained in the on state, the light-emission control transistor $T_{EL\_C}$ is placed in the on state. As a result, while the potential of the first node $ND_1$ is not changed (maintained at $V_{Ofs-L}$=0 volt), the potential of the second node $ND_2$ in the floating state rises, and the potential difference between the first node $ND_1$ and the second node $ND_2$ is brought close to the threshold voltage $V_{th}$ of the drive transistor $T_{Drv}$. If the potential difference between the gate electrode and the source region of the drive transistor $T_{Drv}$ reaches $V_{th}$, the drive transistor $T_{Drv}$ is placed in the off state. Specifically, the potential of the second node $ND_2$ in the floating state is brought close to $(V_{ofs-L}$–$V_{th}$=–3 volt) and finally becomes $(V_{Ofs-L}$–$V_{th})$. If Expression (2) is assured, in other words, if the potential is selected and determined so as to satisfy Expression (2), the light-emitting unit ELP does not emit light.

In [Period-TP(3)$_3$], the potential of the second node $ND_2$ becomes, for example, $(V_{ofs-L}$–$V_{th})$. That is, the potential of the second node $ND_2$ is determined depending on only the threshold voltage $V_{th}$ of the drive transistor $T_{Drv}$ and the voltage $V_{Ofs-L}$ for initializing the gate electrode of the drive transistor $T_{Drv}$. The potential of the second node $ND_2$ does not depend on the threshold voltage $V_{th-EL}$ of the light-emitting unit ELP.

Figure 18B:
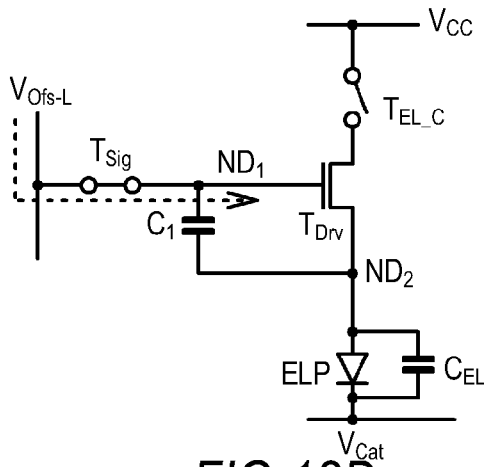

[Period-TP(3)$_4$] (See FIG. 18B)

Thereafter, if the light-emission control transistor control line $CL_{EL\_C}$ is at low level on the basis of the operation of the light-emission control transistor control circuit 103 while the video signal write transistor $T_{Sig}$ is maintained in the on state, the light-emission control transistor $T_{EL\_C}$ is placed in the off state. As a result, the potential of the first node $ND_1$ is not changed (maintained at $V_{Ofs-L}=0$ volt), and the potential of the second node $ND_2$ in the floating state is not changed and held at ($V_{Ofs-L}-V_{th}=-3$ volt).

Next, each period of [Period-TP(3)$_5$] to [Period-TP(3)$_7$] will be described. These periods are substantially the same operations as [Period-TP(5)$_5$] to [Period-TP(5)$_7$] described in the 5Tr/1C driving circuit.

Figure 18C:
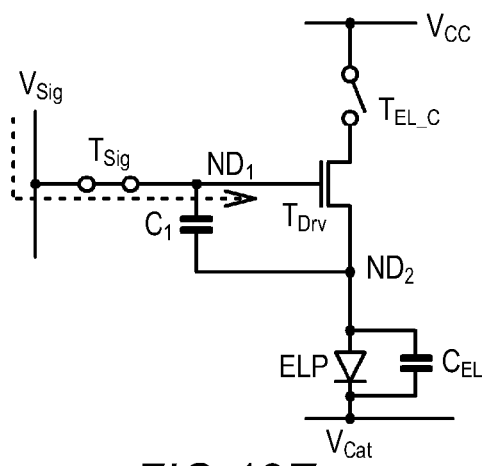

[Period-TP(3)$_5$] (See FIG. 18C)

Next, the write process to the drive transistor $T_{Drv}$ is performed. Specifically, while the video signal write transistor $T_{Sig}$ is maintained in the on state, and the light-emission control transistor $T_{EL\_C}$ is maintained in the off state, the potential of the data line DTL is set to the driving signal (luminance signal) $V_{Sig}$ for controlling luminance of the light-emitting unit ELP on the basis of the operation of the video signal output circuit 102. As a result, the potential of the first node $ND_1$ rises to $V_{Sig}$. The video signal write transistor $T_{Sig}$ may be placed in the off state once, and while the video signal write transistor $T_{Sig}$ and the light-emission control transistor $T_{EL\_C}$ are maintained in the off state, the potential of the data line DTL may be changed to the driving signal (luminance signal) $V_{Sig}$ for controlling luminance of the light-emitting unit ELP. Thereafter, if the scanning line SCL is at high level (that is, by the slowed scanning signal) while the light-emission control transistor $T_{EL\_C}$ is maintained in the off state, the video signal write transistor $T_{Sig}$ may be placed in the on state.

In [Period-TP(3)$_5$], the potential of the first node $ND_1$ rises from $V_{Ofs-L}$ to $V_{Sig}$. For this reason, if a change in the potential of the second node $ND_2$ due to a change in the potential of the first node $ND_1$ is taken into consideration, the potential of the second node $ND_1$ slightly rises. That is, the potential of the second node $ND_1$ can be expressed by $V_{Ofs-L}-V_{th}+\alpha \cdot (V_{Sig}-V_{Ofs-L})$ The relationship $0<\alpha<1$ is established, and the value of $\alpha$ is defined by the capacitive unit $C_1$, the parasitic capacitance $C_{EL}$ of the light-emitting unit ELP, and the like.

Accordingly, as described in the 5Tr/1C driving circuit, a value described in Expression (3') can be obtained as the potential difference between the first node $ND_1$ and the second node $ND_2$, that is, the potential difference $V_{gs}$ between the gate electrode and the source region of the drive transistor $T_{Drv}$.

$$V_{gs} \approx V_{Sig}-(V_{Ofs-L}-V_{th})-\alpha \cdot (V_{Sig}-V_{Ofs-L}) \quad (3')$$

That is, in the 3Tr/1C driving circuit, $V_{gs}$ which is obtained in the write process to the drive transistor $T_{Drv}$ depends on only the driving signal (luminance signal) $V_{Sig}$ for controlling luminance of the light-emitting unit ELP, the threshold voltage $V_{th}$ of the drive transistor $T_{Drv}$, and the voltage $V_{Ofs-L}$ for initializing the gate electrode of the drive transistor $T_{Drv}$. $V_{gs}$ does not depend on the threshold voltage $V_{th-EL}$ of the light-emitting unit ELP.

Figure 18D:
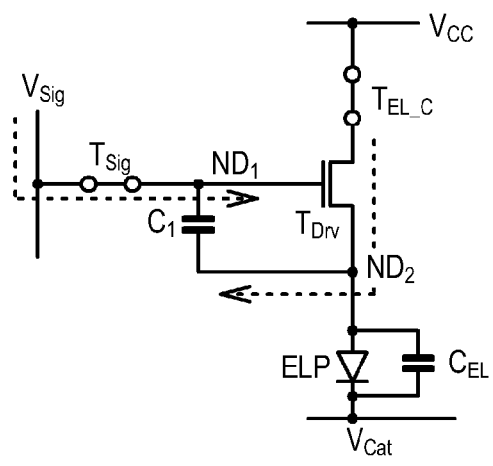

[Period-TP(3)$_6$] (See FIG. 18D)

Thereafter, the potential of the source region of the drive transistor $T_{Drv}$ (second node $ND_2$) is corrected on the basis of the magnitude of mobility $\mu$ of the drive transistor $T_{Drv}$ (mobility correction process). Specifically, the same operation as [Period-TP(5)$_6$] described in the 5Tr/1C driving circuit may be performed. A predetermined time (the full time $t_0$ of [Period-TP(3)$_6$]) for performing the mobility correction process may be determined in advance as a design value at the time of design for the display device.

Figure 18E:
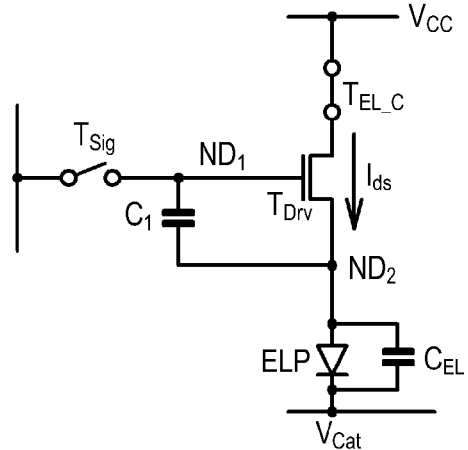

[Period-TP(3)$_7$] (See FIG. 18E)

With the above-described operation, the threshold voltage cancel process, the write process, and the mobility correction process are completed. Since the same process as [Period-TP(5)$_7$] described in the 5Tr/1C driving circuit is performed, and the potential of the second node $ND_2$ rises and exceeds ($V_{th-EL}+V_{Cat}$), the light-emitting unit ELP starts to emit light. At this time, since a current which flows in the light-emitting unit ELP can be obtained by Expression (5), the current $I_{ds}$ which flows in the light-emitting unit ELP does not depend on the threshold voltage $V_{th-EL}$ of the light-emitting unit ELP and the threshold voltage $V_{th}$ of the drive transistor $T_{Drv}$. That is, the light-emission amount (luminance) of the light-emitting unit ELP is not affected by the threshold voltage $V_{th-EL}$ of the light-emitting unit ELP and the threshold voltage $V_{th}$ of the drive transistor $T_{Drv}$. It is also possible to suppress the occurrence of variation in the drain current $I_{ds}$ due to variation in mobility $\mu$ of the drive transistor $T_{Drv}$.

The light-emission state of the light-emitting unit ELP continues up to the (m+m'-1)th horizontal scanning period. This time corresponds to the end of [Period-TP(3)$_{-1}$].

With the above, the operation of light emission of the light-emitting unit ELP [the (n,m)th subpixel] is completed.

Example 6

Example 6 relates to a 2Tr/1C driving circuit. FIG. 19 is a conceptual diagram of a circuit which constitutes a display device of Example 6. FIG. 20 shows an equivalent circuit diagram of a 2Tr/1C driving circuit. FIG. 21 is a schematic driving timing chart. FIGS. 22A to 22F schematically show the on/off state and the like of each transistor.

In the 2Tr/1C driving circuit, three transistors of the first node initialization transistor $T_{ND1}$, the light-emission control transistor $T_{EL\_C}$, and the second node initialization transistor $T_{ND2}$ are removed from the above-described 5Tr/1C driving circuit. That is, the 2Tr/1C driving circuit has two transistors of a video signal write transistor $T_{Sig}$ and a drive transistor $T_{Drv}$, and one capacitive unit $C_1$.

[Drive Transistor $T_{Drv}$]

The configuration of the drive transistor $T_{Drv}$ is the same as the drive transistor $T_{Drv}$ described in the 5Tr/1C driving circuit, and thus detailed description thereof will not be repeated. The drain region of the drive transistor $T_{Drv}$ is connected to the current supply unit 100. The voltage $V_{CC-H}$ for controlling light emission of the light-emitting unit ELP and the voltage $V_{CC-L}$ for controlling the potential of the source region of the drive transistor $T_{Drv}$ are supplied from the current supply unit 100. The values of the voltage $V_{CC-H}$ and $V_{CC-L}$ may be as follows.

$V_{CC-H}=20$ volt $V_{CC-L}=-10$ volt

However, the voltage $V_{CC-H}$ and $V_{CC-L}$ are not limited to these values.

[Video Signal Write Transistor $T_{Sig}$]

The configuration of the video signal write transistor $T_{Sig}$ is the same as the video signal write transistor $T_{Sig}$ described in the 5Tr/1C driving circuit, and thus detailed description thereof will not be repeated.

[Light-Emitting Unit ELP]

The configuration of the light-emitting unit ELP is the same as the light-emitting unit ELP described in the 5Tr/1C driving circuit, and thus detailed description thereof will not be repeated.

Hereinafter, the operation of the 2Tr/1C driving circuit will be described.

Figure 22A:
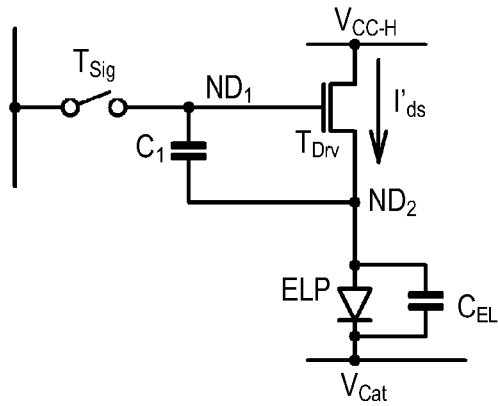
FIGS. 22A to 22F are diagrams schematically showing the on/off state and the like of each transistor which constitutes a 2Tr/1C driving circuit of Examples 1 and 6.

[Period-TP(2)$_{-1}$] (See FIGS. 21 and 22A)

[Period-TP(2)$_{-1}$] is, for example, the operation in the previous display frame, and is substantially the same operation as [Period-TP(5)$_{-1}$] in the 5Tr/1C driving circuit.

[Period-TP(2)$_0$] to [Period-TP(2)$_2$] shown in FIG. 21 are the periods corresponding to [Period-TP(5)$_0$] to [Period-TP(5)$_4$] shown in FIG. 6, and are the operation periods immediately before the next write process is performed. Similarly to the 5Tr/1C driving circuit, in [Period-TP(2)$_0$] to [Period-TP(2)$_2$], the (n,m)th light-emitting unit ELP is in the non-light-emission state. As shown in FIG. 21, the operation of the 2Tr/1C driving circuit is different from the operation of the 5Tr/1C driving circuit in that, in addition to [Period-TP(2)$_3$], [Period-TP(2)$_1$] to [Period-TP(2)$_2$] are also included in the m-th horizontal scanning period. For convenience of description, description will be provided assuming that the beginning of [Period-TP(2)$_1$] and the end of [Period-TP(2)$_3$] respectively match the beginning and end of the m-th horizontal scanning period.

Hereinafter, each period of [Period-TP(2)$_0$] to [Period-TP(2)$_2$] will be described. As described in the 5Tr/1C driving circuit, the length of each period of [Period-TP(2)$_1$] to [Period-TP(2)$_3$] may be appropriately selected in accordance with design for the display device.

Figure 22B:
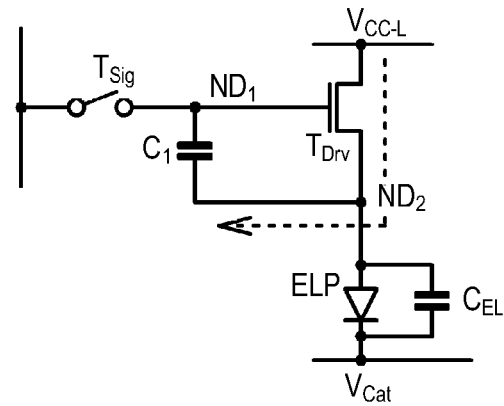

[Period-TP(2)$_0$] (See FIG. 22B)

[Period-TP(2)$_0$] is, for example, the operation from the previous display frame to the current display frame. That is, [Period-TP(2)$_0$] is the period from the (m+m')th horizontal scanning period in the previous display frame to the (m−1)th horizontal scanning period in the current display frame. In [Period-TP(2)$_0$], the (n,m)th light-emitting unit ELP is in the non-light-emission state. At the time of change from [Period-TP(2)$_{-1}$] to [Period-TP(2)$_0$], a voltage which is supplied from the current supply unit 100 is switched from $V_{CC-H}$ to voltage $V_{CC-L}$. As a result, the potential of the second node ND$_2$ (the source region of the drive transistor T$_{Drv}$ or the anode electrode of the light-emitting unit ELP) drops down to $V_{CC-L}$, and the light-emitting unit ELP is placed in the non-light-emission state. In order to follow the potential drop of the second node ND$_2$, the potential of the first node ND$_1$ (the gate electrode of the drive transistor T$_{Drv}$) in the floating state also drops.

Figure 22C:
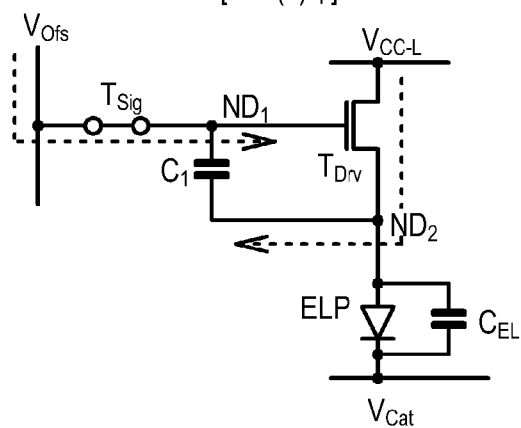

[Period-TP(2)$_1$] (See FIG. 22C)

The horizontal scanning period of the m-th row in the current display frame starts. At the time of the start of [Period-TP(2)$_1$], if the scanning line SCL is at high level on the basis of the operation of the scanning circuit 101, the video signal write transistor T$_{Sig}$ is placed in the on state. As a result, the potential of the first node ND$_1$ becomes $V_{Ofs}$ (for example, 0 volt). The potential of the second node ND$_2$ is held at $V_{CC-L}$ (for example, −10 volt).

With the above process, the potential difference between the gate electrode and the source region of the drive transistor T$_{Drv}$ is equal to or greater than $V_{th}$, and the drive transistor T$_{Drv}$ is placed in the on state.

Figure 22D:
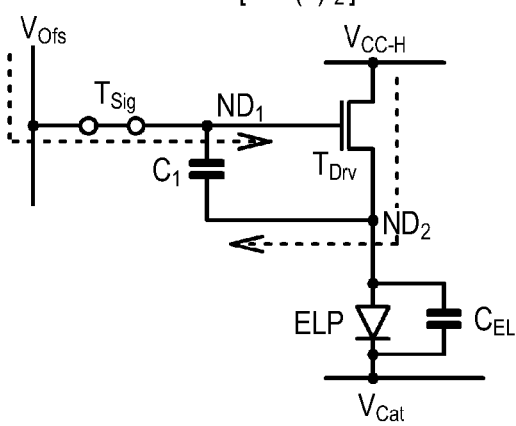

[Period-TP(2)$_2$] (See FIG. 22D)

Next, the threshold voltage cancel process is performed. That is, while the video signal write transistor T$_{Sig}$ is maintained in the on state, the voltage which is supplied from the current supply unit 100 is switched from the voltage $V_{CC-L}$ to the voltage $V_{CC-H}$. As a result, while the potential of the first node ND$_1$ is not changed (maintained at $V_{Ofs}$=0 volt), the potential of the second node ND$_2$ in the floating state rises, and the potential difference between the first node ND$_1$ and the second node ND$_2$ is brought close to the threshold voltage $V_{th}$ of the drive transistor T$_{Drv}$. If the potential difference between the gate electrode and the source region of the drive transistor T$_{Drv}$ reaches $V_{th}$, the drive transistor T$_{Drv}$ is placed in the off state. Specifically, the potential of the second node ND$_2$ in the floating state is brought close to ($V_{Ofs}$−$V_{th}$=−3 volt) and finally becomes ($V_{Ofs}$−$V_{th}$) If Expression (2) is assured, in other words, if the potential is selected and determined so as to satisfy Expression (2), the light-emitting unit ELP does not emit light.

In [Period-TP(2)$_2$], the potential of the second node ND$_2$ finally becomes, for example, ($V_{Ofs}$−$V_{th}$). That is, the potential of the second node ND$_2$ depends on only the threshold voltage $V_{th}$ of the drive transistor T$_{Drv}$ and the voltage $V_{Ofs}$ for initializing the gate electrode of the drive transistor T$_{Drv}$. The potential of the second node ND$_2$ does not depend on the threshold voltage $V_{th-EL}$ of the light-emitting unit ELP.

Figure 22E:
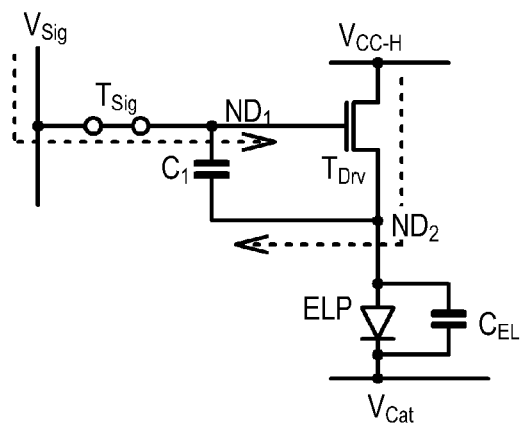

[Period-TP(2)$_3$] (See FIG. 22E)

Next, the write process to the drive transistor T$_{Drv}$ is performed and the potential of the source region of the drive transistor T$_{Drv}$ (the second node ND$_2$) is corrected on the basis of the magnitude of mobility μ of the drive transistor T$_{Drv}$ (mobility correction process). Specifically, while the video signal write transistor T$_{Sig}$ is maintained in the on state, the potential of the data line DTL is set to the driving signal (luminance signal) $V_{Sig}$ for controlling luminance of the light-emitting unit ELP on the basis of the operation of the video signal output circuit 102. As a result, the potential of the first node ND$_1$ rises to $V_{Sig}$, and the drive transistor T$_{Drv}$ is placed in the on state. The video signal write transistor T$_{Sig}$ may be placed in the off state once, the potential of the data line DTL may be changed to the driving signal (luminance signal) $V_{Sig}$ for controlling luminance of the light-emitting unit ELP, and then, if the scanning line SCL is at high level (that is, by the slowed scanning signal), the video signal write transistor T$_{Sig}$ may be placed in the on state, such that the drive transistor T$_{Drv}$ may be placed in the on state.

Unlike the description of the 5Tr/1C driving circuit, since the potential $V_{CC-H}$ is applied from the current supply unit 100 to the drain region of the drive transistor T$_{Drv}$, the potential of the source region of the drive transistor T$_{Drv}$ rises. When a predetermined time (t$_0$) has elapsed, if the scanning line SCL is at low level, the video signal write transistor T$_{Sig}$ is placed in the off state, and the first node ND$_1$ (the gate electrode of the drive transistor T$_{Drv}$) is placed in the floating state. The full time t$_0$ of [Period-TP(2)$_3$] may be determined in advance as a design value at the time of design for the display device such that the potential of the second node ND$_2$ becomes ($V_{Ofs}$−$V_{th}$+ΔV).

In [Period-TP(2)$_3$], when the value of mobility μ of the drive transistor T$_{Drv}$ is large, the amount ΔV of rise in the potential of the source region of the drive transistor T$_{Drv}$ is large. When the value of mobility μ of the drive transistor T$_{Drv}$ is small, the amount ΔV of rise in the source region of the drive transistor T$_{Drv}$ is small.

Figure 22F:
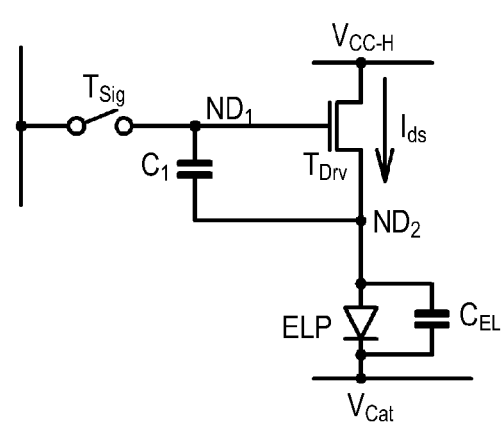
Figure 23A:
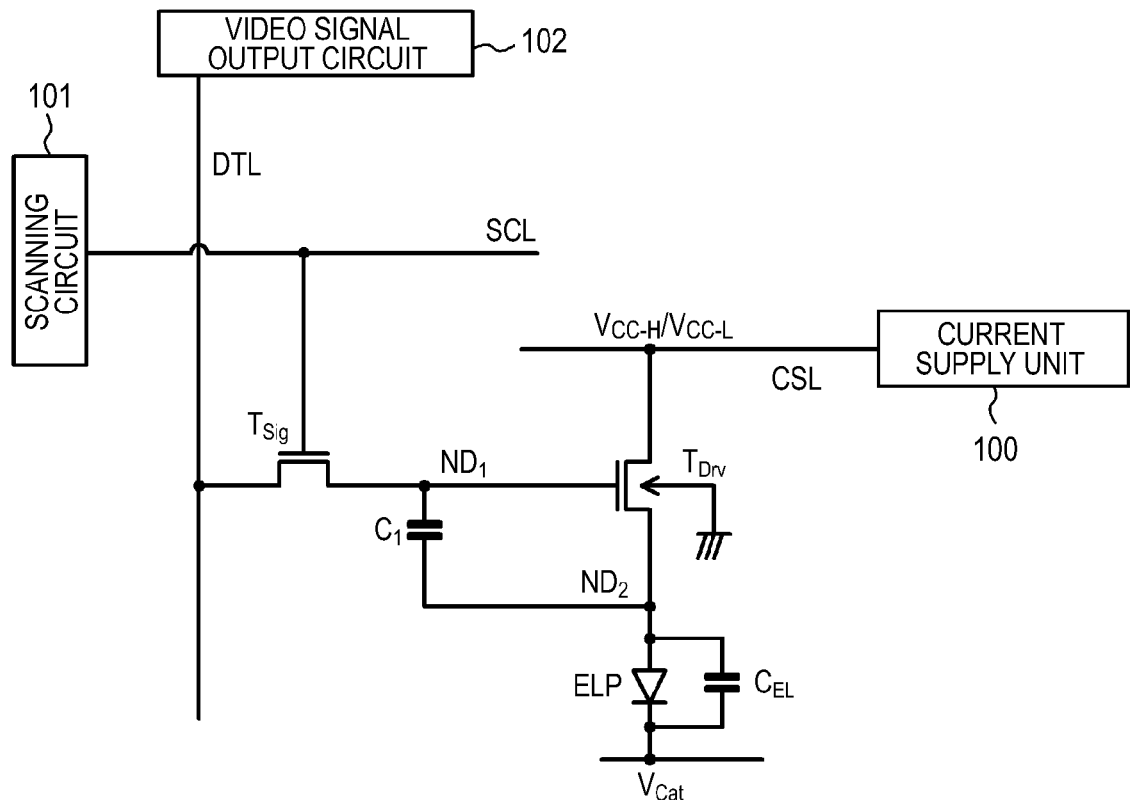
FIG. 23A is a circuit diagram of a driving circuit of an existing organic EL display device.
Figure 23B:
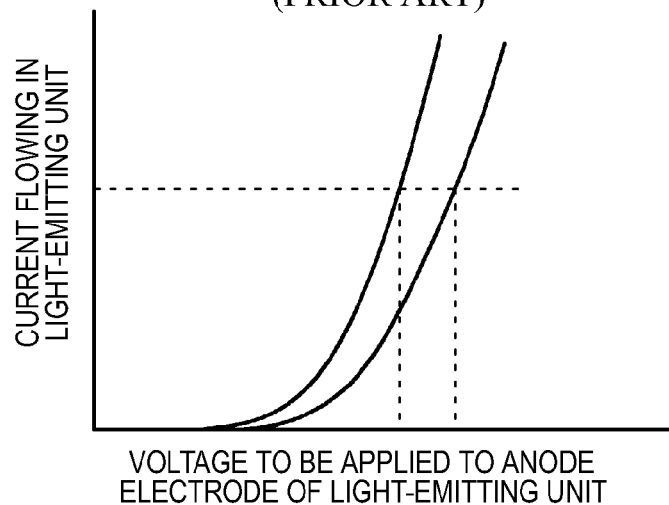
FIG. 23B is a diagram schematically showing deterioration in the I-V characteristic of a light-emitting unit when the light-emitting unit is deteriorated.

[Period-TP(2)$_4$] (See FIG. 22F)

With the above-described operation, the threshold voltage cancel process, the write process, and the mobility correction process are completed. Since the same process as [Period-TP(5)$_7$] described in the 5Tr/1C driving circuit is performed, and the potential of the second node ND$_2$ rises and exceeds ($V_{th-EL}$+$V_{Cat}$), the light-emitting unit ELP starts to emit light. At this time, since the current which flows in the light-emitting unit ELP can be obtained by Expression (5), the current $I_{ds}$ which flows in the light-emitting unit ELP does not depend on the threshold voltage $V_{th\text{-}EL}$ of the light-emitting unit ELP and the threshold voltage $V_{th}$ of the drive transistor $T_{Drv}$. That is, the light-emission amount (luminance) of the light-emitting unit ELP is not affected by the threshold voltage $V_{th\text{-}EL}$ of the light-emitting unit ELP and the threshold voltage $V_{th}$ of the drive transistor $T_{Drv}$. It is also possible to suppress the occurrence of variation in the drain current $I_{ds}$ due to variation in mobility μ of the drive transistor $T_{Drv}$.

The light-emission state of the light-emitting unit ELP continues up to the (m+m'−1)th horizontal scanning period. This time corresponds to the end of [Period-TP(2)$_{-1}$].

With the above, the operation of light emission of the light-emitting unit ELP [the (n,m)th subpixel] is completed.

Although the display device according to the embodiments of the present disclosure and the electronic apparatus have been described on the basis of the preferred examples, the display device according to the embodiments of the present disclosure and the electronic apparatus are not limited to these examples. The configuration or structure of the display device or the driving circuit in the examples are for illustration and may be appropriately changed. The driving method is for illustration, and may be appropriately changed. For example, in the operation of the 2Tr/1C driving circuit, [Period-TP(2)$_3$] may be divided into two periods of [Period-TP(2)$_3$] and [Period-TP(2)'$_3$]. In [Period-TP(2)$_3$], as described above, the video signal write transistor $T_{Sig}$ may be placed in the off state once, and the potential of the data line DTL may be changed to the driving signal (luminance signal) $V_{Sig}$ for controlling luminance of the light-emitting unit ELP. Thereafter, in [Period-TP(2) $T_3$], if the scanning line SCL is at high level, the video signal write transistor $T_{Sig}$ may be placed in the on state, such that the drive transistor $T_{Drv}$ may be placed in the on state. Although in the examples, a case where various transistors are of an n-channel type has been described, in some cases, a part or the whole of the driving circuit may be constituted by a p-channel transistor. The display device according to the embodiments of the present disclosure may be applied to, for example, a television receiver, a monitor constituting a digital camera, a monitor constituting a video camera, a monitor constituting a personal computer, various display units in a personal digital assistant (PDA), a mobile phone, a smart phone, a portable music player, a game machine, an electronic book, and an electronic dictionary, an electronic view finder (EVF), and a head mounted display (HMD). That is, examples of the electronic apparatus according to the embodiment of the present disclosure include a television receiver, a digital camera, a video camera, a personal computer, a PDA, a mobile phone, a smart phone, a portable music player, a game machine, an electronic book, an electronic dictionary, an electronic view finder, and a head mounted display. The display device according to the embodiments of the present disclosure is provided in these electronic apparatuses. Although in the examples, a case where a display unit is exclusively constituted by an organic electroluminescence light-emitting unit has been described, the light-emitting unit may be constituted by a self-luminous light-emitting unit, such as an inorganic electroluminescence light-emitting unit, an LED light-emitting unit, or a semiconductor laser light-emitting unit.

The present disclosure contains subject matter related to that disclosed in Japanese Priority Patent Application JP 2011-181797 filed in the Japan Patent Office on Aug. 23, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:
a plurality of light-emitting elements, each light-emitting element has light-emitting unit and a driving circuit configured to drive the light-emitting unit,
wherein the driving circuit at least includes a drive transistor, a video signal write transistor and a capacitive unit which is located between the drive transistor and the video signal write transistor, and
wherein the drive transistor is provided within a first conduction type second well, which is provided within a second conduction-type first well, and the second conduction-type first well is provided within a first conduction-type semiconductor substrate,
wherein a connection region of a first conduction type, provided within the first conduction type second well, electrically connects the first conduction type second well to an electrode of the capacitive unit located between the drive transistor and the video signal write transistor, and
wherein the electrode of the capacitive unit electrically connects the connection region to one of a second conduction-type source region or drain region of the drive transistor.

2. The display device according to the claim 1, wherein the drive transistor has a channel forming region and a gate electrode.

3. The display device according to the claim 1, wherein the video signal write transistor has a source region, a drain region, a channel forming region, and a gate electrode.

4. The display device according to the claim 1, wherein a gate electrode of the drive transistor is connected to one of a source region or a drain region of the video signal write transistor and to an end of the capacitive unit.

5. The display device according to the claim 1, wherein one of a source region or a drain region of the video signal write transistor is connected to a corresponding data line.

6. The display device according to the claim 1, wherein a gate electrode of the video signal write transistor is connected to a corresponding scanning line.

7. The display device according to the claim 1, wherein the first conduction-type semiconductor substrate is a silicon substrate, and
wherein the video signal write transistor is provided in the first conduction-type semiconductor substrate.

8. The display device according to the claim 1, wherein one of the second conduction-type source region or drain region of the drive transistor is connected to a corresponding current supply line.

9. The display device according to the claim 8, wherein one of the second conduction-type source region or drain region, other than one of the second conduction-type source region or drain region of the drive transistor connected to the corresponding current supply line, is connected to the light-emitting unit and to an end of the capacitive unit.

* * * * *